(12) United States Patent
Huang et al.

(10) Patent No.: US 11,785,825 B2
(45) Date of Patent: Oct. 10, 2023

(54) QUANTUM DOT-ORGANIC LIGHT EMITTING DISPLAY PANEL AND DISPLAY DEVICE

(71) Applicant: BOE Technology Group Co., Ltd., Beijing (CN)

(72) Inventors: Haitao Huang, Beijing (CN); Shi Shu, Beijing (CN); Qi Yao, Beijing (CN); Chuanxiang Xu, Beijing (CN); Zhao Cui, Beijing (CN); Lina Jing, Beijing (CN); Renquan Gu, Beijing (CN); Yong Yu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 282 days.

(21) Appl. No.: 17/210,733

(22) Filed: Mar. 24, 2021

(65) Prior Publication Data

US 2022/0102431 A1 Mar. 31, 2022

(30) Foreign Application Priority Data

Sep. 25, 2020 (CN) .......................... 202011022085.5

(51) Int. Cl.
*H10K 59/38* (2023.01)
*H10K 50/854* (2023.01)
*H10K 50/856* (2023.01)
*H10K 50/86* (2023.01)
*H10K 59/12* (2023.01)
*H10K 102/00* (2023.01)

(52) U.S. Cl.
CPC ........... *H10K 59/38* (2023.02); *H10K 50/854* (2023.02); *H10K 50/856* (2023.02); *H10K 50/865* (2023.02); *H10K 59/12* (2023.02); *H10K 2102/331* (2023.02)

(58) Field of Classification Search
CPC .... H10K 59/38; H10K 50/854; H10K 50/856; H10K 50/865; H10K 59/122
See application file for complete search history.

(56) References Cited

U.S. PATENT DOCUMENTS

2014/0168572 A1* 6/2014 Iwata ...................... H05B 33/14
349/61
2017/0125740 A1* 5/2017 Lee ...................... H10K 50/856
2017/0133357 A1* 5/2017 Kuo ...................... H01L 25/167
(Continued)

*Primary Examiner* — Nduka E Ojeh
(74) *Attorney, Agent, or Firm* — ArentFox Schiff LLP; Michael Fainberg

(57) ABSTRACT

A display panel is provided with a plurality of sub-pixel areas and includes: a base substrate, a light emitting structure including a plurality of light emitting devices corresponding to the sub-pixel areas, an encapsulating layer, and a pixel defining layer. The pixel defining layer includes: a plurality of openings; at least two sub-pixel defining layers, and a quantum dot color film layer. Each of the sub-pixel defining layers is provided with a pixel separator. The pixel separators fence each of the plurality of openings, and define the plurality of sub-pixel areas. In the at least two sub-pixel defining layers, the sectional shape of the pixel separator in the sub-pixel defining layer which is farthest away from the encapsulating layer includes a regular trapezoid. The quantum dot color film layer includes a plurality of quantum dot color films arranged in the corresponding openings.

20 Claims, 24 Drawing Sheets

(56) References Cited

U.S. PATENT DOCUMENTS

| | | | |
|---|---|---|---|
| 2021/0028327 A1* | 1/2021 | Lin | H01L 25/0753 |
| 2022/0037411 A1* | 2/2022 | Zhang | H10K 50/865 |
| 2022/0052296 A1* | 2/2022 | Noh | H10K 59/12 |
| 2022/0392961 A1* | 12/2022 | Kim | H10K 59/38 |

* cited by examiner

QUANTUM DOT-ORGANIC LIGHT EMITTING DISPLAY PANEL AND DISPLAY DEVICE

CROSS REFERENCE TO RELATED APPLICATION

This application is based on and claims priority under 35 U.S.C. 119 to Chinese Patent Application No. 202011022085.5, filed on Sep. 25, 2020, in the China National Intellectual Property Administration. The entire disclosure of the above application is incorporated herein by reference.

FIELD

The disclosure relates to the technical field of display, in particular to a display panel and a display device.

BACKGROUND

QD-OLED (quantum dot-organic light emitting display) panel is an emerging display technology, which combines quantum dot transfer film and OLED. A light emitting layer is added to the structure of the original OLED screen, in which blue light is emitted by a blue OLED, and red light and green light are emitted through red and green quantum dot transfer films respectively.

Since OLED in the QD-OLED panel only emits light in one color, the QD-OLED panel greatly reduces manufacturing difficulty and production cost, and has wider color gamut coverage and brightness performance than the OLED.

SUMMARY

Embodiments of the disclosure provide a display panel and a display device, and a device structure with high luminous efficiency.

Embodiments of the disclosure provide a display panel, with a plurality of sub-pixel areas in an array, including: a base substrate; a light emitting structure, an encapsulating layer, and a pixel defining layer. The light emitting structure is disposed on a side of the base substrate, and includes a plurality of light emitting devices in one-to-one correspondence with the plurality of sub-pixel areas. The encapsulating layer is disposed on a side, facing away from the base substrate, of the light emitting structure. The pixel defining layer is disposed on a side, facing away from the base substrate, of the encapsulating layer. The pixel defining layer includes: a plurality of openings, at least two sub-pixel defining layers, and a quantum dot color film layer. Each of the sub-pixel defining layers is provided with a pixel separator. The pixel separator fences each of the plurality of openings, and defines the plurality of sub-pixel areas. In the at least two sub-pixel defining layers, a sectional shape of the pixel separator in the sub-pixel defining layer which is farthest away from the encapsulating layer includes a regular trapezoid. The quantum dot color film layer includes a plurality of quantum dot color films arranged in corresponding openings.

Embodiments of the disclosure further provide a display device, including the above display panel provided in embodiments of the disclosure.

DETAILED DESCRIPTION OF THE EMBODIMENTS

Figure 1:
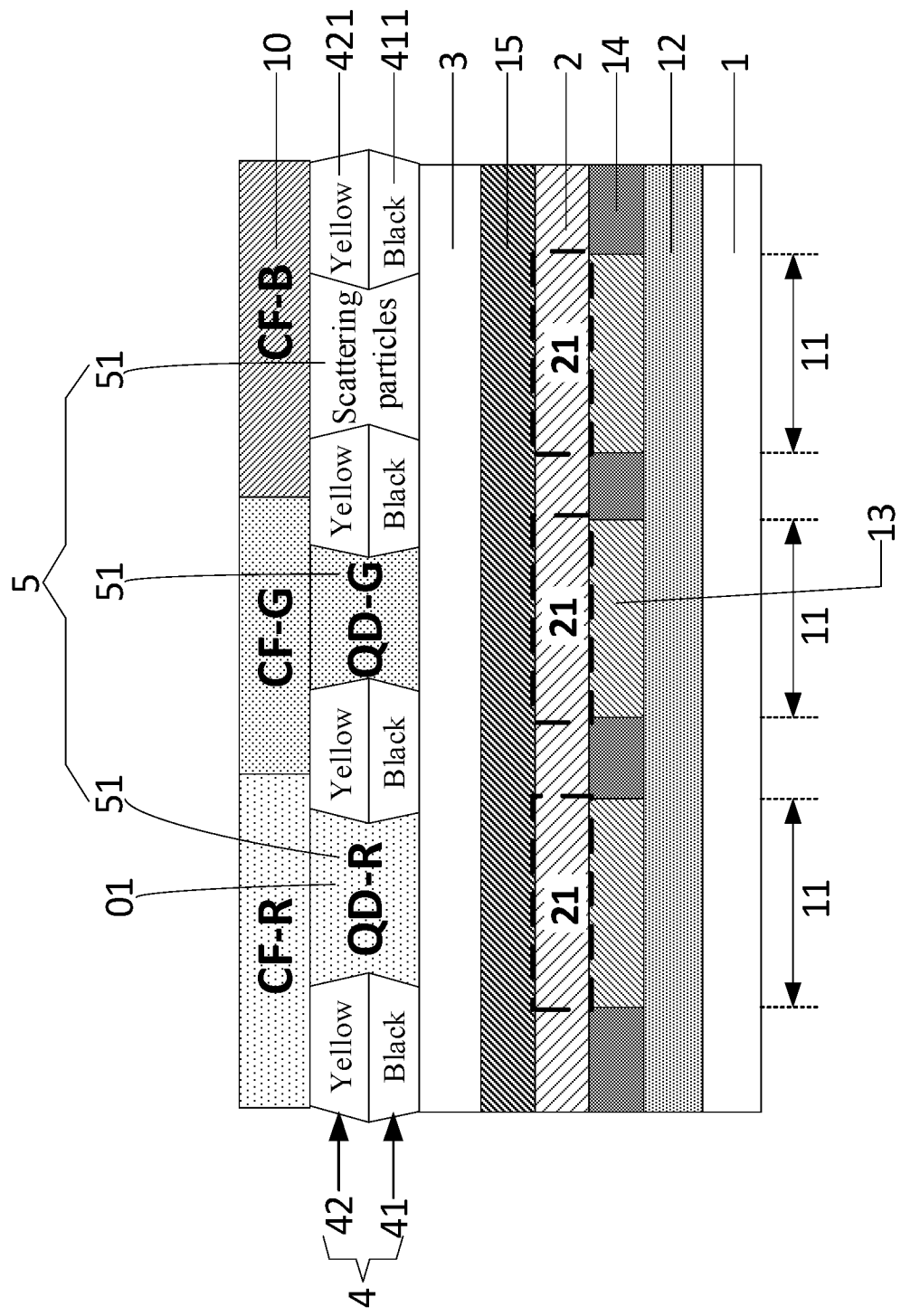
FIG. 1 is a structural schematic diagram of a display panel according to some embodiments.

To make the objective, technical solutions and advantages of the disclosure clearer, a detailed description will be given below on specific implementations of the display panel and the display device provided in embodiments of the disclosure.

The thickness and shape of each layer of film in the drawings do not reflect the true scale of the display panel, and are merely intended to schematically illustrate contents of the disclosure.

The disclosure is finished based on the following knowledge and findings of the inventor: the inventor found after researches that, in the display device that adopts printed quantum dot color films, for the purpose of a favorable color conversion ability, the thickness of the quantum dot color film generally needs to be about 10 um. As such, if a pixel defining layer with a hollow area of a great depth can be prepared, the color conversion ability of the quantum dot color film can be improved, and further the display performance of the display device can be improved. While the existing process and material for preparing the pixel defining layer to accommodate and limit ink cannot satisfy the requirement in preparing the pixel defining layer with a thickness of about 10 um, incomplete development easily occurs, which may lead to residue of material of the pixel defining layer in the area corresponding to the quantum dot color film, then display may be influenced. Therefore, at least for the purpose of improving the color conversion ability of the quantum dot color film, there is the problem of difficulty in material development of the pixel defining layer. The inventor also found that, in the case that the pixel defining layer needs to be manufactured on the OLED light emitting device layer, since the OLED light emitting device is not resistant to high temperature, a low-temperature manufacturing process is required, which leads to the problem of incomplete curing of the pixel defining layer. In this way, when quantum dot ink is printed, crosstalk will occur to ink in adjacent pixels, then the display effect is influenced.

In view of this, embodiments of the disclosure provide a display panel. As shown in FIG. 1, the display panel is provided with a plurality of sub-pixel areas 11 in an array, and includes:
a base substrate 1;
a light emitting structure 2 on a side of the base substrate 1, including a plurality of light emitting devices 21 in one-to-one correspondence with the plurality of sub-pixel areas 11;
an encapsulating layer 3 on a side, facing away from the base substrate 1, of the light emitting structure 2;
a pixel defining layer 4 on a side, facing away from the base substrate 1, of the encapsulating layer 3, where the pixel defining layer 4 includes:
a plurality of openings 01;
at least two sub-pixel defining layers (with two sub-pixel defining layers 41 and 42 as an example), where each of the sub-pixel defining layers (41, 42) is provided with a pixel separator (411, 421); the pixel separator (411, 421) fences each of the plurality of openings 41, and defines the plurality of sub-pixel areas 11; in the at least two sub-pixel defining layers (41, 42), the sectional shape of the pixel separator (421) in the sub-pixel defining layer (42) which is farthest away from the encapsulating layer (3) includes a regular trapezoid; and
a quantum dot color film layer 5, including a plurality of quantum dot color films 51 arranged in the corresponding openings 01 respectively.

Since a thicker quantum dot color film layer needs to be manufactured to improve the color conversion ability of the quantum dot color film layer in the related technology, then a pixel defining layer with a hollow area of a great depth needs to be prepared, the pixel defining layer is generally made of resin material, and is formed through exposure and development processes. If the pixel defining layer is thicker, then the problem of residue of resin material will exist in development each time. While as to the above display panel provided in embodiments of the disclosure, the pixel defining layer 4 is set to include at least two sub-pixel defining layers (41, 42). As such, a thicker pixel defining layer can be manufactured through two development processes, while the problem of residue of development when the pixel defining layer is manufactured each single time will not exist. Further, the sectional shape of the pixel separator (421) in the sub-pixel defining layer (42) farthest away from the encapsulating layer 3 is set to be a regular trapezoid, thereby increasing the light emitting viewing angle of the sub-pixel area 11.

In some embodiments, in the above display panel provided in embodiments of the disclosure, as shown in FIG. 1, at least two sub-pixel defining layers include a first sub-pixel defining layer 41 closest to the encapsulating layer 3, and a second sub-pixel defining layer 42 farthest away from the encapsulating layer 3. In some embodiments, if the thickness of the quantum dot color film layer 5 is about 10 um, then the sum of the thickness of the first sub-pixel defining layer 41 and the thickness of the second sub-pixel defining layer 42 is also about 10 um. Then the thickness of the first sub-pixel defining layer 41 and the second sub-pixel defining layer 42 can be respectively about Sum, the first sub-pixel defining layer 41 and the second sub-pixel defining layer 42 can be respectively manufactured through two development processes respectively. The thickness of each development can be respectively about Sum, and the problem that the existing process and material for preparing the pixel defining layer to accommodate and limit ink cannot satisfy the requirement in preparing the pixel film defining layer with a thickness of about 10 um can be solved, and the problem of development residue in the pixel defining layer of about 10 um which is made in a single time in the related art can be avoided.

The first sub-pixel defining layer 41 is provided with a first pixel separator 411, and the sectional shape of the first pixel separator 411 can include an inverted trapezoid or a rectangle. In some embodiments, due to the influence of the manufacturing process, the sectional shape of the first pixel separator 411 is generally an inverted trapezoid with the section being wide at the top and narrow at the bottom. Here the distance from the bottom of the inverted trapezoid to the encapsulating layer 3 is larger than the distance from the top of the inverted trapezoid to the encapsulating layer 3. It should be noted that embodiments of the disclosure are illustrated with the section of the first pixel separator 411 being an inverted trapezoid as an example.

The second sub-pixel defining layer 42 is provided with a second pixel separator 421, the sectional shape of the second pixel separator 421 includes a regular trapezoid with the section being narrow at the top and wide at the bottom, thereby increasing the light emitting viewing angle of the sub-pixel area 11. Here, the distance from the top of the regular trapezoid to the encapsulating layer 3 is larger than the distance from the top of the regular trapezoid to the encapsulating layer 3.

Figure 2:
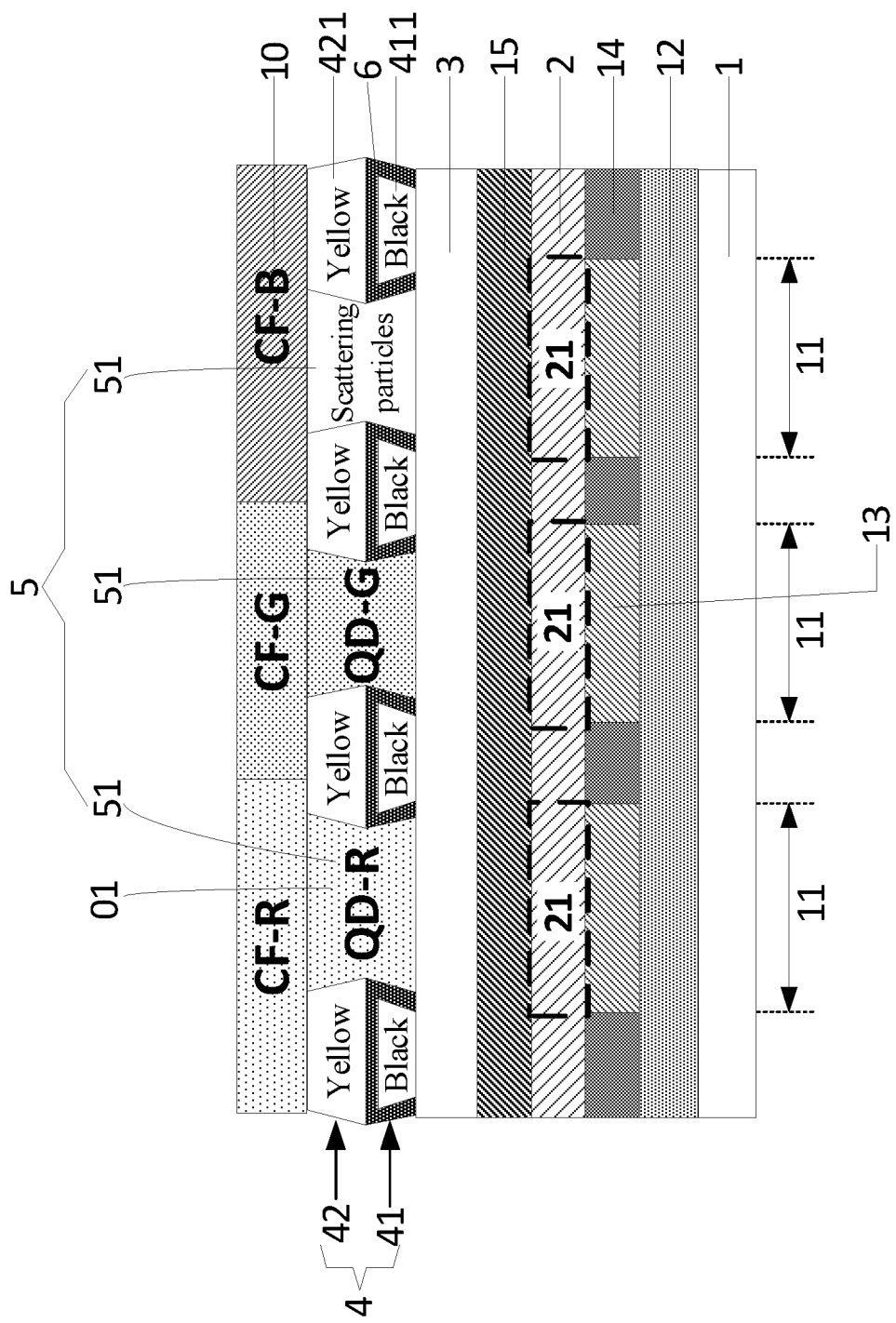
FIG. 2 is a structural schematic diagram of another display panel according to some embodiments.

In some embodiments, the quantum dot color film layer is generally formed through an ink-jet printing process, that is, the quantum dot color film layer is formed by mixing quantum dots in ink for printing. Since the light emitting device is not resistant to high temperature, the film layer following the light emitting device needs a low-temperature manufacturing process (about 85° C.), which usually leads to poor compactness of the film layer since the color film layer can not be completely cured in such low temperature. Some pores may exist inside the film layer of poor compactness, and crosstalk may easily occur to ink in adjacent sub-pixel areas. However, in the disclosure, as shown in FIG. 2, the above display panel further includes a first reflective structure 6 covering the first pixel separator 411. The first reflective structure 6 can at least prevent crosstalk of part of the ink between adjacent sub-pixel areas 11, thereby improving the display effect. The material of the first reflective structure 6 is metal, which can reflect light to further improve the luminous efficiency of the quantum dot color film layer 5, and can further block crosstalk of ink between adjacent sub-pixel areas 11.

In some embodiments, the material of the first reflective structure can be silver or aluminum, and the thickness of the first reflective structure can be 1000 nm-5000 nm.

Figure 3:
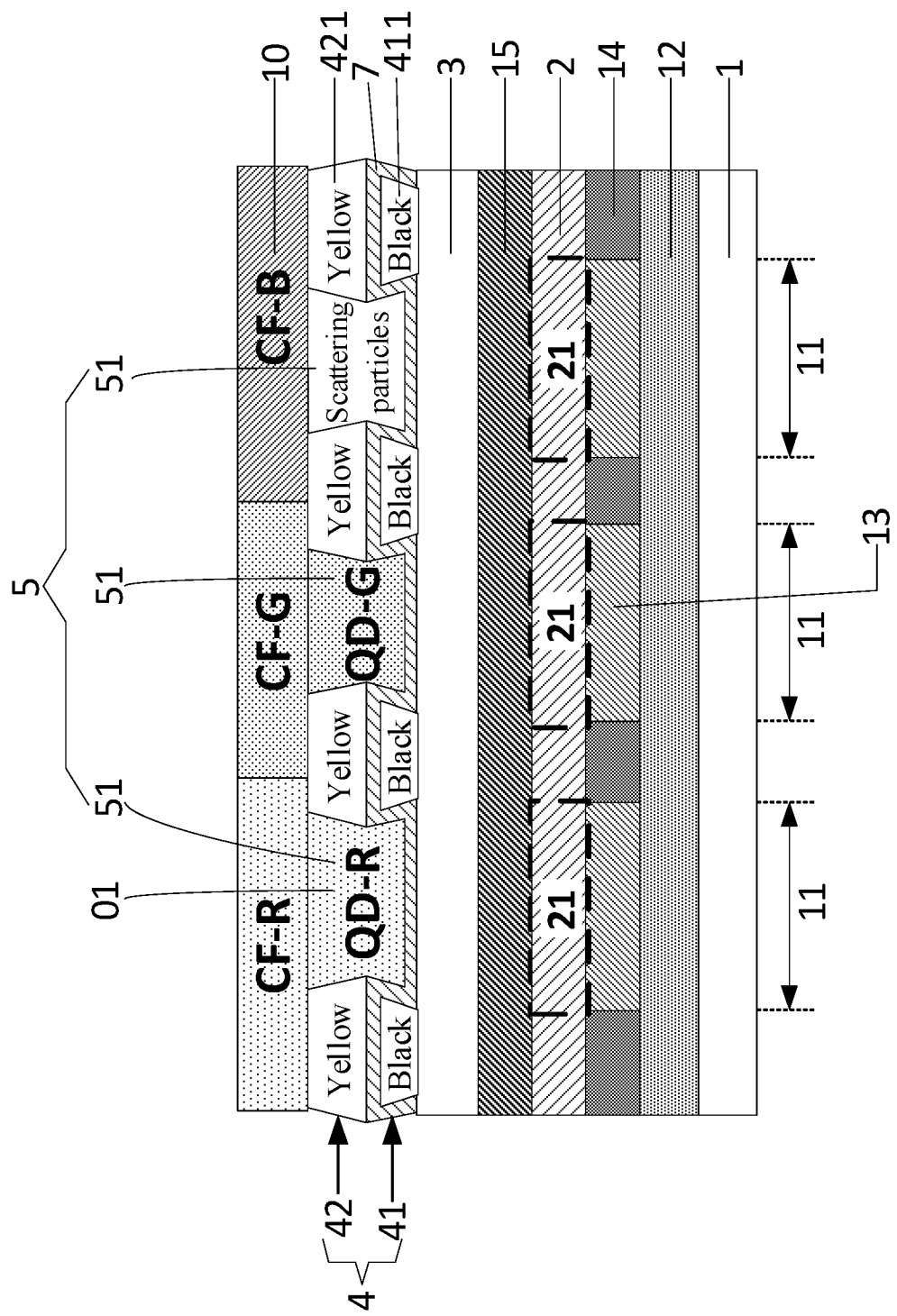
FIG. 3 is a structural schematic diagram of still another display panel according to some embodiments.
Figure 4:
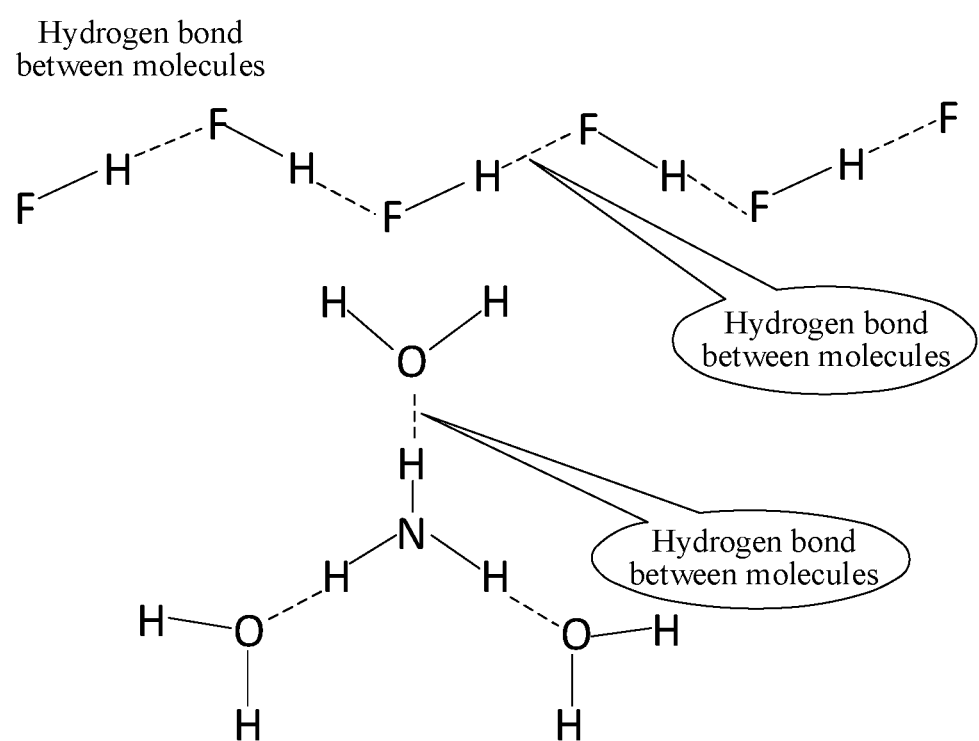
FIG. 4 is a schematic diagram showing the hydrogen bonds.
Figure 5:
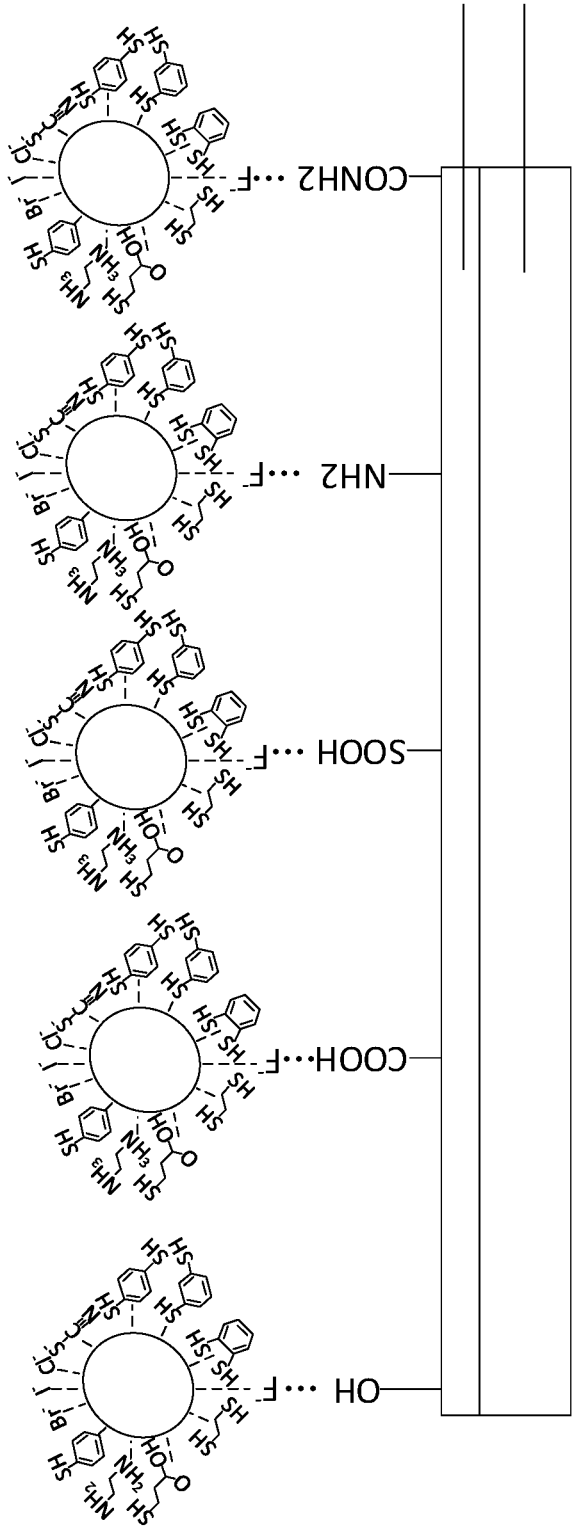
FIG. 5 is a schematic diagram illustrating graphene being anchored at hydrogen bond in quantum dot color film layer.

In some embodiments, as shown in FIG. 3, the display panel provided in embodiments of the disclosure includes a first graphene layer 7 covering the first pixel separator 411 and the opening 01. The first graphene layer 7 is provided with an active functional group which can be tightly anchored to the quantum dot color film layer 5 through hydrogen bonds. In some embodiments, a layer of graphene can be deposited through a chemical vapor deposition (CVD) process, to perform surface plasma activation processing on the graphene, such that the surface can be provided with a large number of active functional groups, to obtain a functional first graphene layer 7. In this way, on the one hand, through the active functional group on the surface of the functionalized first graphene layer 7, the quantum dots in the quantum dot color film layer 5 can be tightly anchored on the surface of the functionalized first graphene layer 7 through hydrogen bonds, thereby forming a dense and uniform quantum dot color film layer 5. In this way, crosstalk of quantum dots to a neighboring sub-pixel area 11 can be prevented, and film formation uniformity of the quantum dot color film layer 5 can be improved simultaneously. In addition, the functionalized first graphene layer 7 can provide more printing sites (that is, more quantum dots can be anchored than before), thereby reducing the thickness of the quantum dot color film layer 5 in a certain extent, improving the original complex thick-film process, and saving materials and lowering cost simultaneously. In some embodiments, the structural schematic diagram of effects of a hydrogen bond is as shown in FIG. 4, a hydrogen bond (often informally abbreviated H-bond) is a primarily electrostatic force of attraction between a hydrogen (H) atom which is covalently bound to a more electronegative atom or group, and is often represented by X—H·Y. The strength of the hydrogen bond is related to the magnitude of electronegativity of X and Y. The larger the electronegativity, the stronger the hydrogen bond, and the smaller the radius, the closer to X—H, and the stronger the formed hydrogen bond, so F—H·F is the strongest hydrogen bond. The specific structural schematic diagram of quantum dots of the quantum dot color film layer 5 closely anchored to the surface of the functionalized first graphene layer 7 through hydrogen bonds is shown in FIG. 5. The active functional groups on the surface of graphene generally include hydroxyl (—OH), carboxyl (—COOH), amino (—NH2), etc. The surface of quantum dots in the quantum dot color film layer 5 generally includes a large number of ligands, among which fluorine ion ($F^-$) can form hydrogen bonding interaction with the active functional groups on the surface of the first graphene layer 7, therefore, the active functional groups on the surface of the first graphene layer 7 can be closely anchored with the quantum dot color film layer 5 through hydrogen bonds.

In some embodiments, in the above display panel provided in embodiments in the disclosure, the thickness of the first graphene layer can be 100 nm-2000 nm.

Figure 6:
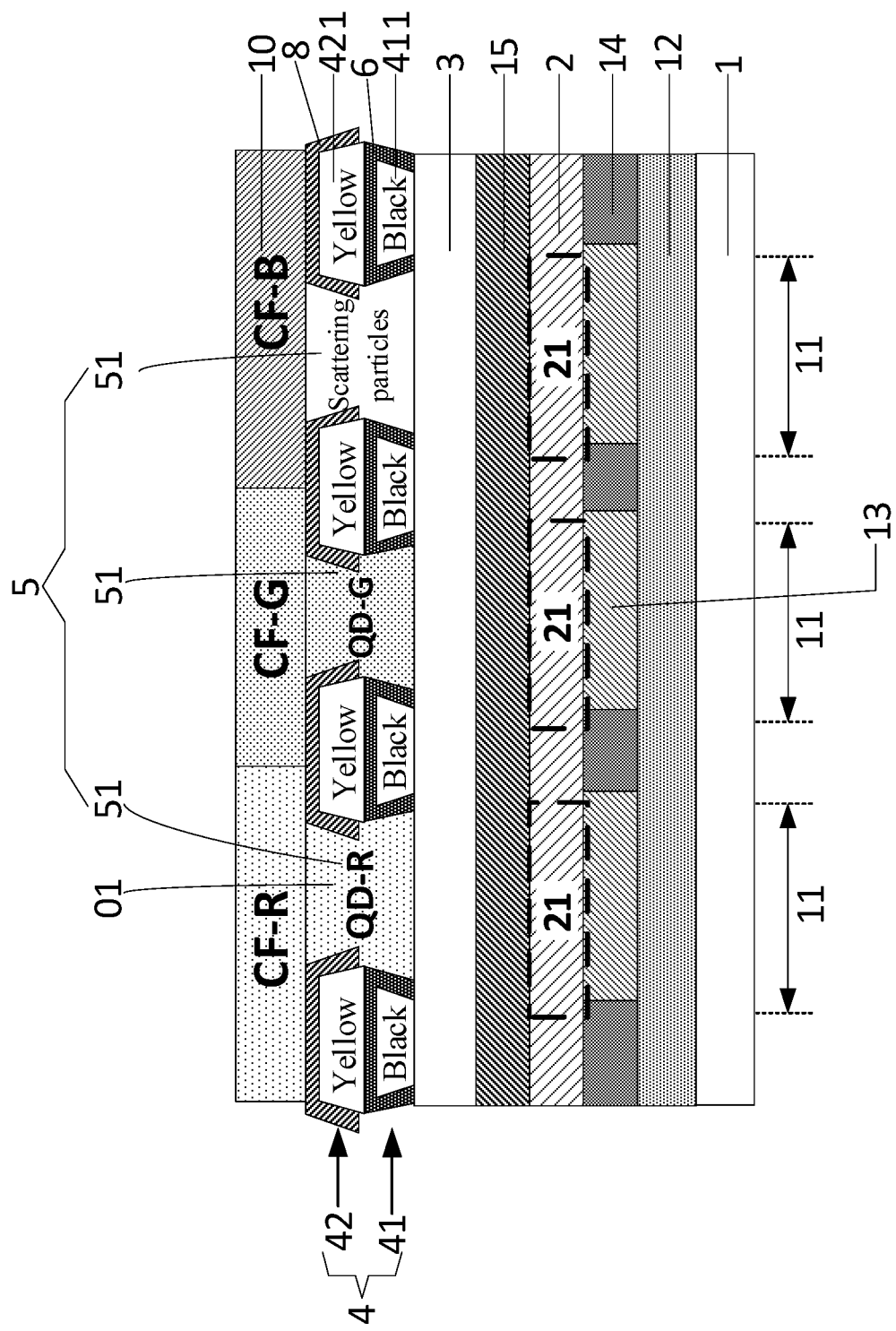
FIG. 6 is a structural schematic diagram of a display panel provided with a second reflective layer according to some embodiments.
Figure 7:
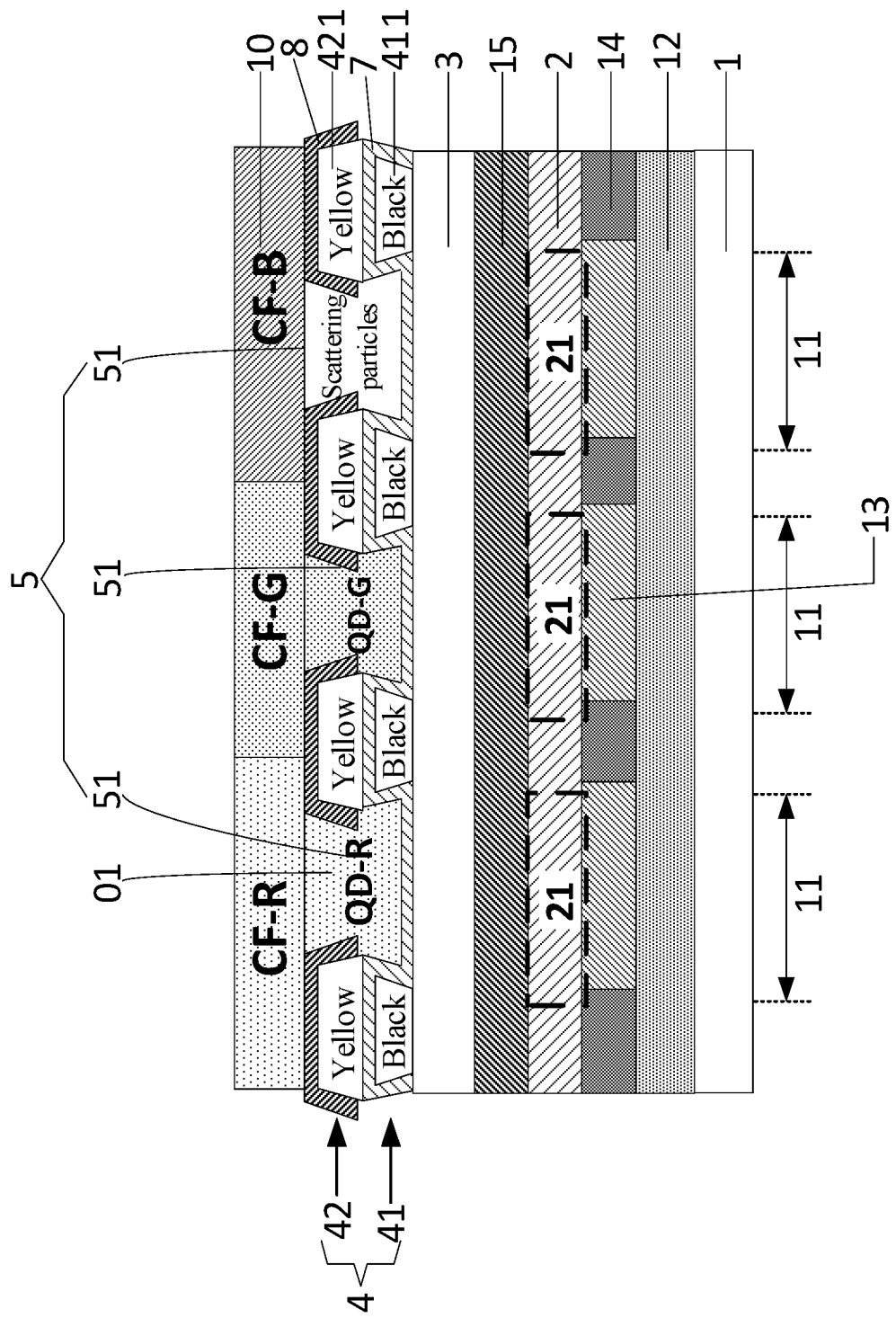
FIG. 7 is a structural schematic diagram of another display panel provided with a second reflective layer according to some embodiments.

In some embodiments, as shown in FIG. 6 and FIG. 7, the above display panel provided in embodiments of the disclosure further includes a second reflective structure 8 covering the second pixel separator 421. The second reflective structure 8 can block the crosstalk of part of the ink between adjacent sub-pixel areas 11, thereby further improving display effect. The material of the second reflective structure 8 is metal, which can reflect light to further improve the luminous efficiency of the quantum dot color film layer 5, and can further block crosstalk of ink between adjacent sub-pixel areas 11.

In some embodiments, in the above display panel provided in embodiments of the disclosure, the material of the second reflective structure can be silver or aluminum, and the thickness of the second reflective structure can be 1000 nm-5000 nm.

Figure 8:
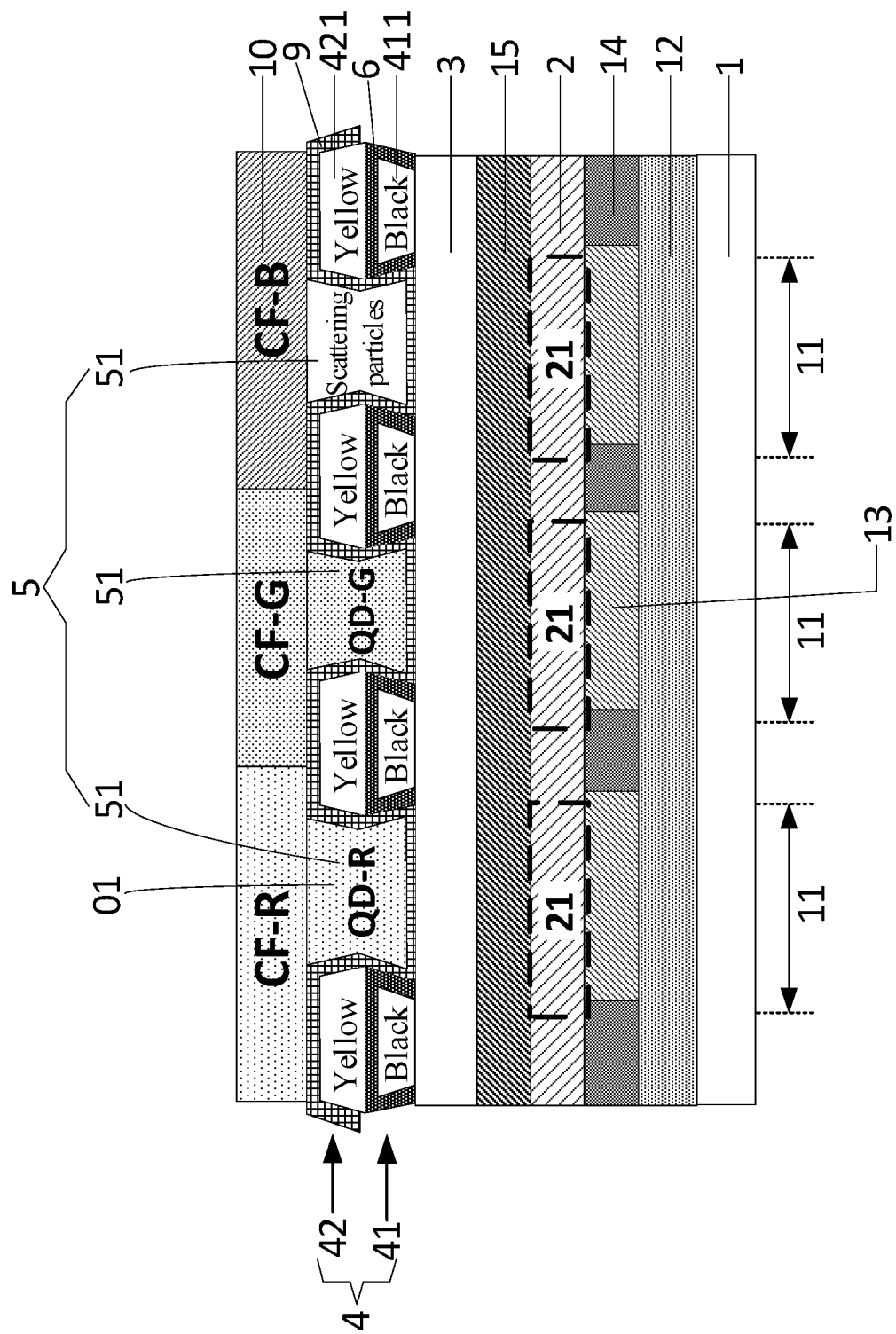
FIG. 8 is a structural schematic diagram of a display panel provided with a second graphene layer according to some embodiments.
Figure 9:
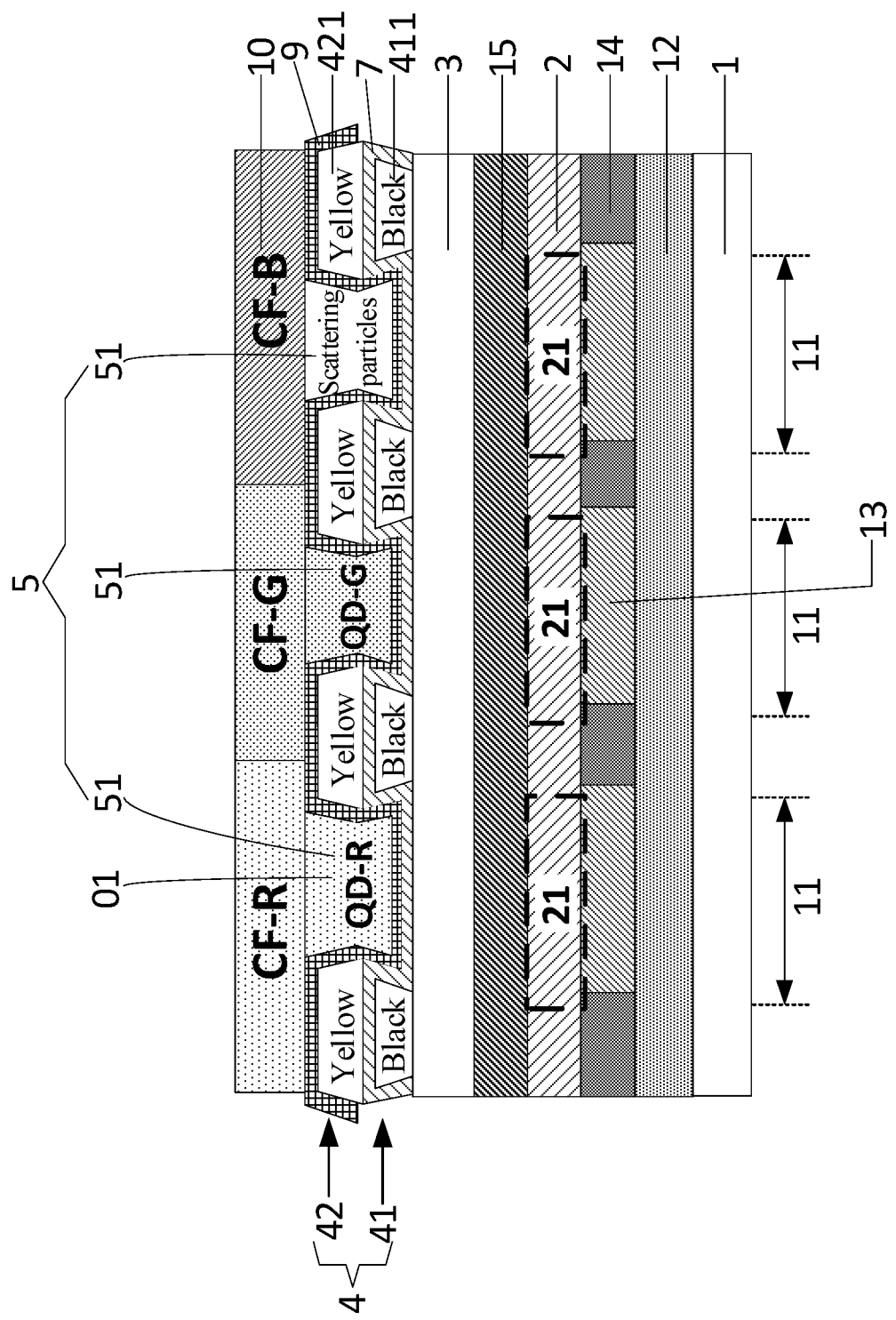
FIG. 9 is a structural schematic diagram of another display panel provided with a second graphene layer according to some embodiments.
Figure 10:
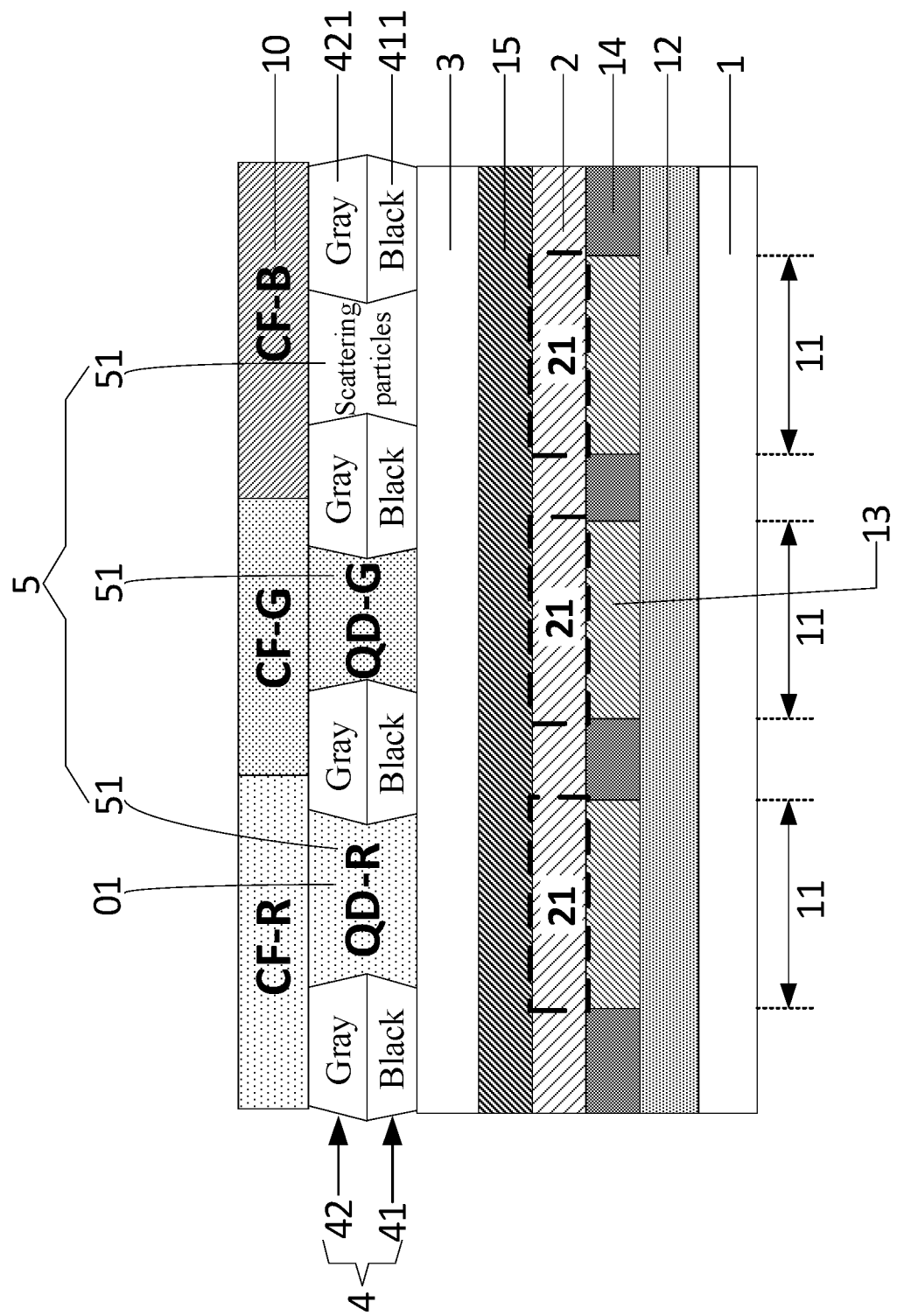
FIG. 10 is a structural schematic diagram of a display panel provided with a first sub-pixel defining layer of black and a second sub-pixel defining layer of gray according to some embodiments.
Figure 11:
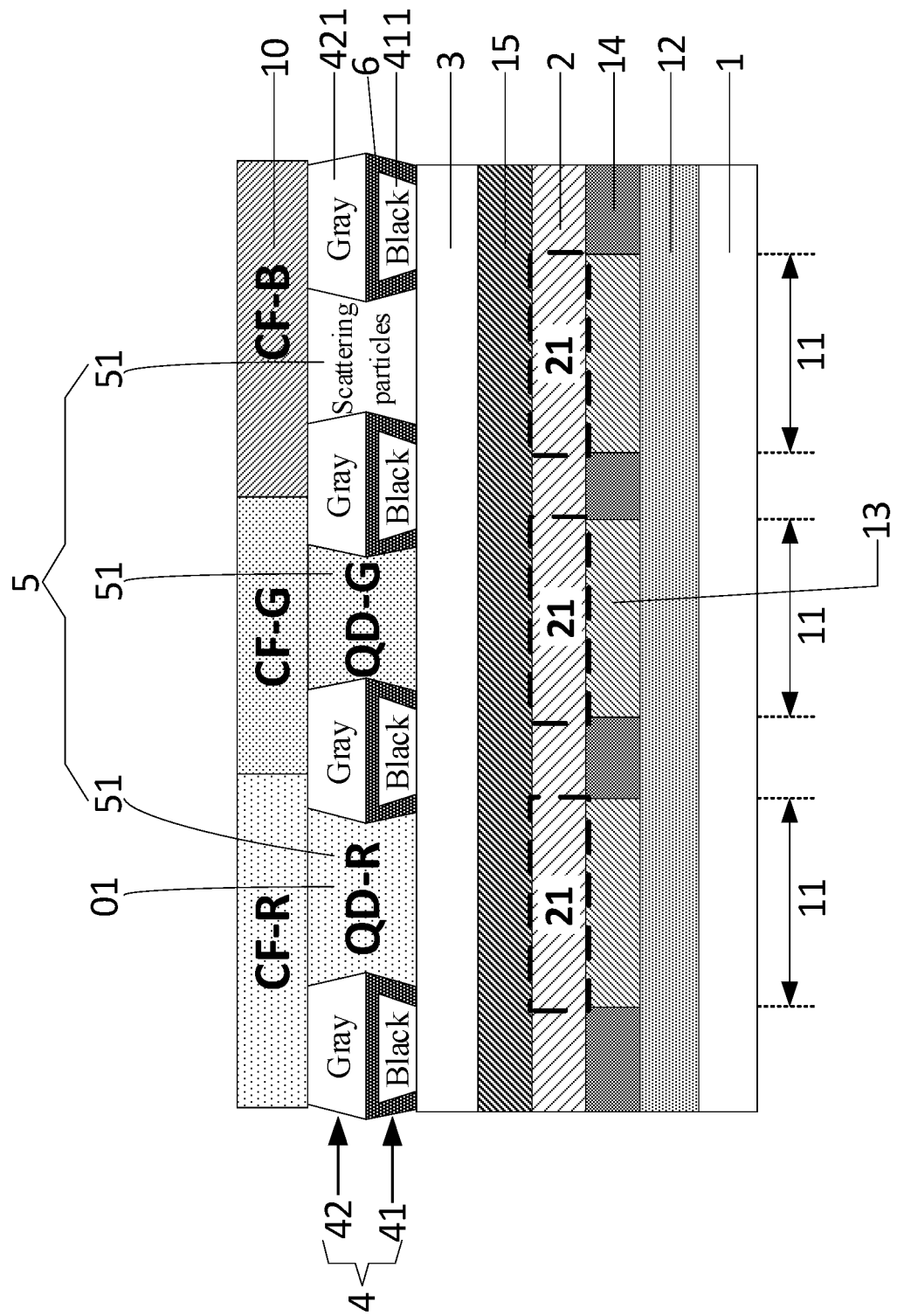
FIG. 11 is a structural schematic diagram of another display panel provided with a first sub-pixel defining layer of black and a second sub-pixel defining layer of gray according to some embodiments.
Figure 12:
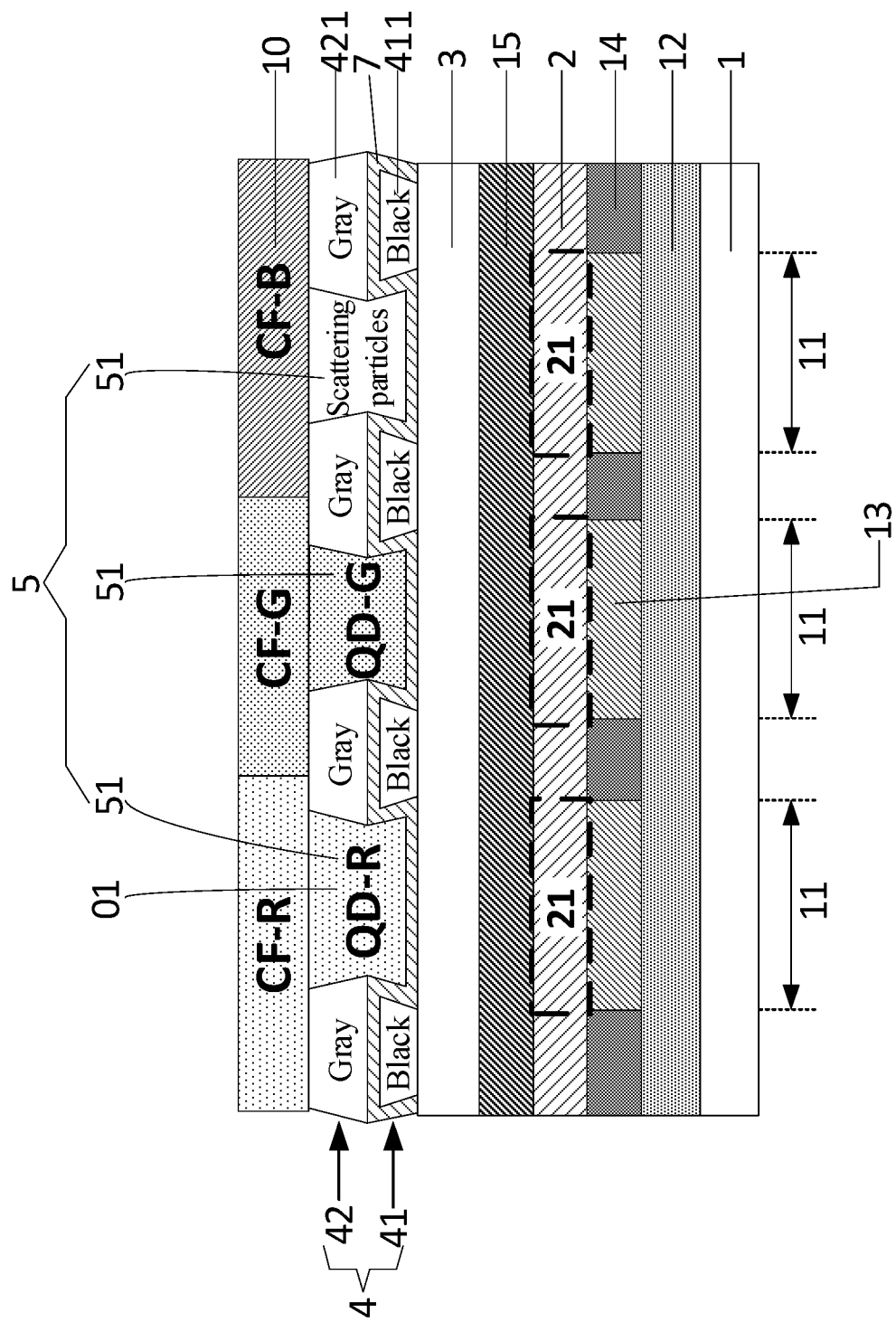
FIG. 12 is a structural schematic diagram of another display panel provided with a first sub-pixel defining layer of black and a second sub-pixel defining layer of gray according to some embodiments.
Figure 13:
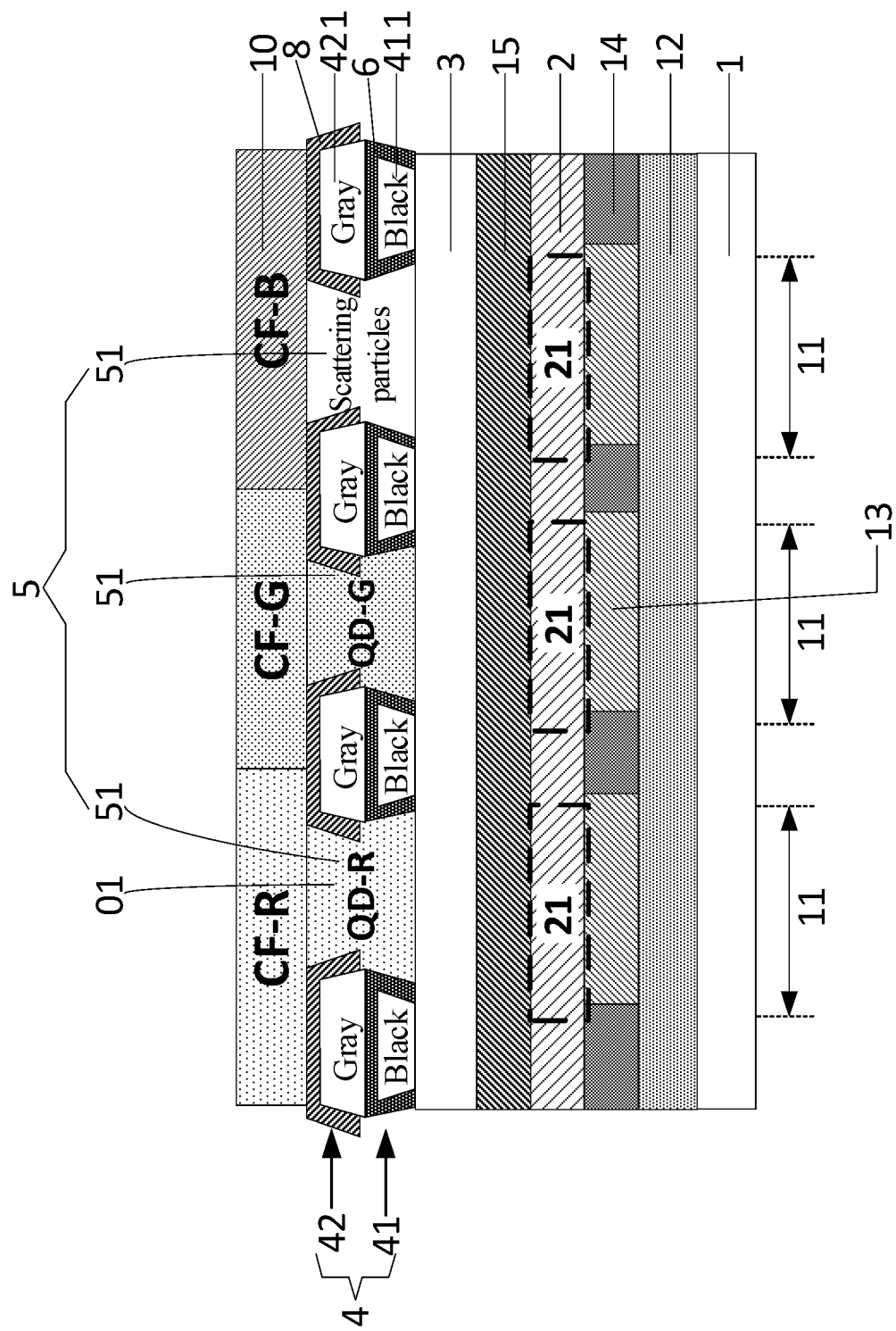
FIG. 13 is a structural schematic diagram of another display panel provided with a first sub-pixel defining layer of black and a second sub-pixel defining layer of gray according to some embodiments.
Figure 14:
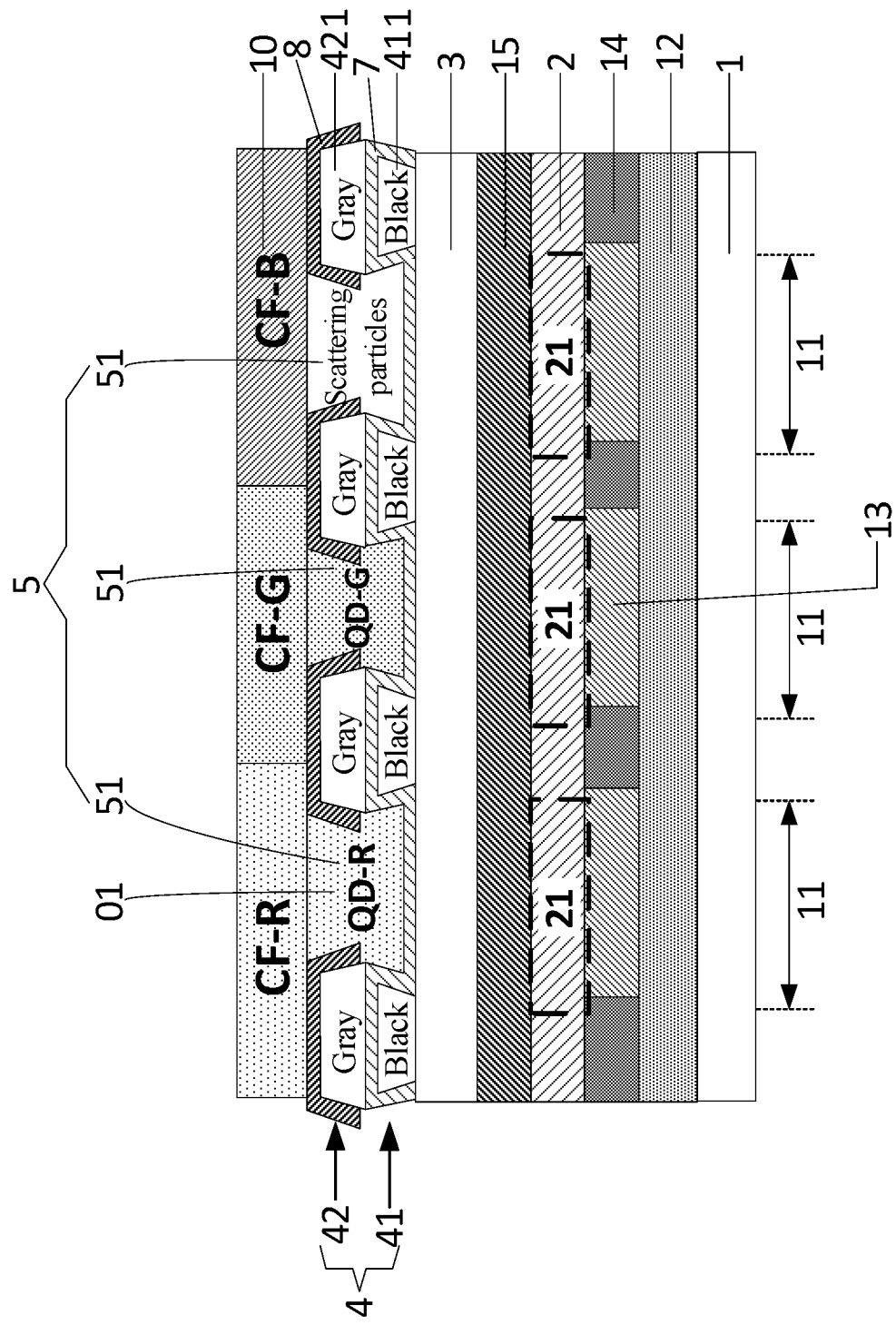
FIG. 14 is a structural schematic diagram of another display panel provided with a first sub-pixel defining layer of black and a second sub-pixel defining layer of gray according to some embodiments.
Figure 15:
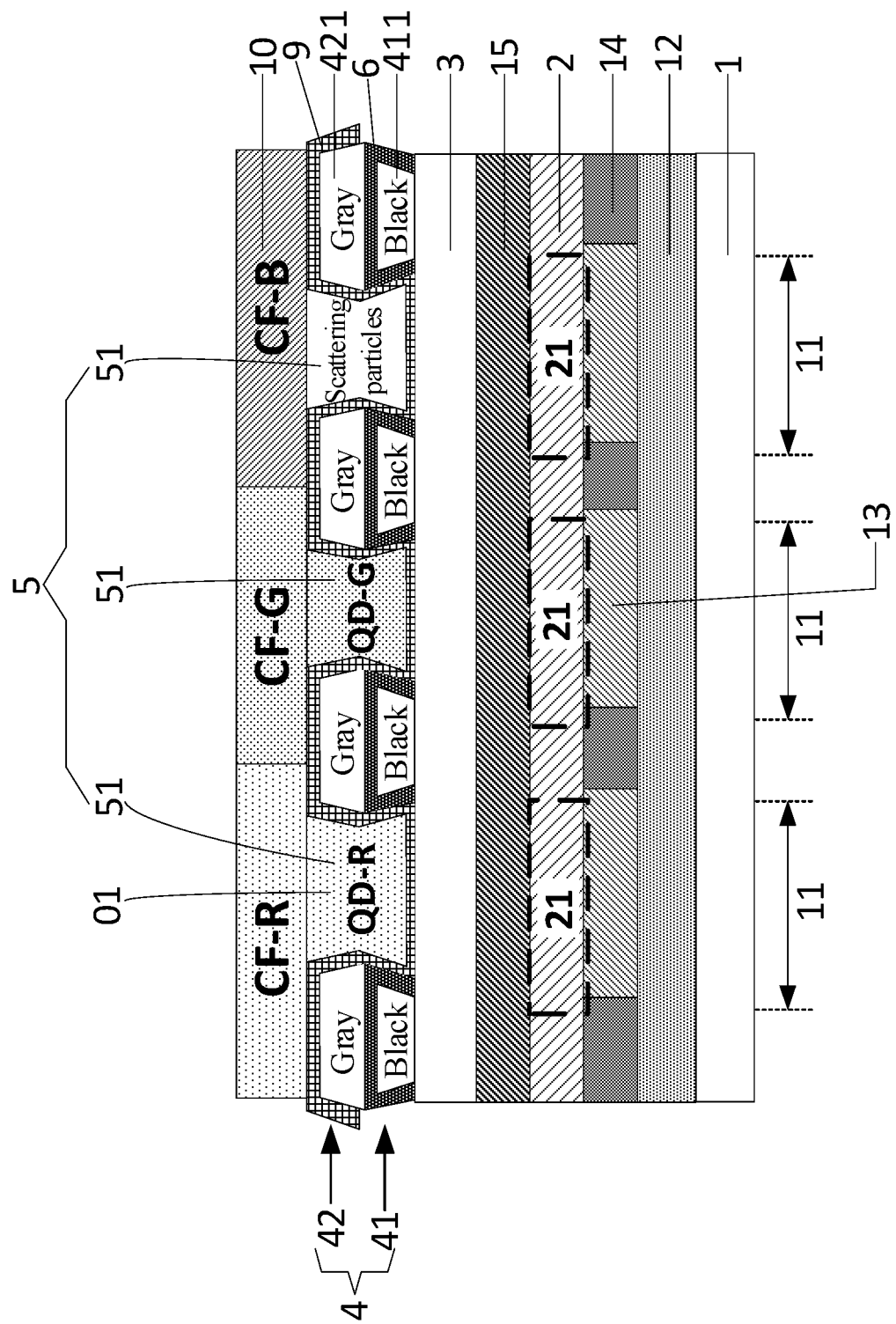
FIG. 15 is a structural schematic diagram of another display panel provided with a first sub-pixel defining layer of black and a second sub-pixel defining layer of gray according to some embodiments.
Figure 16:
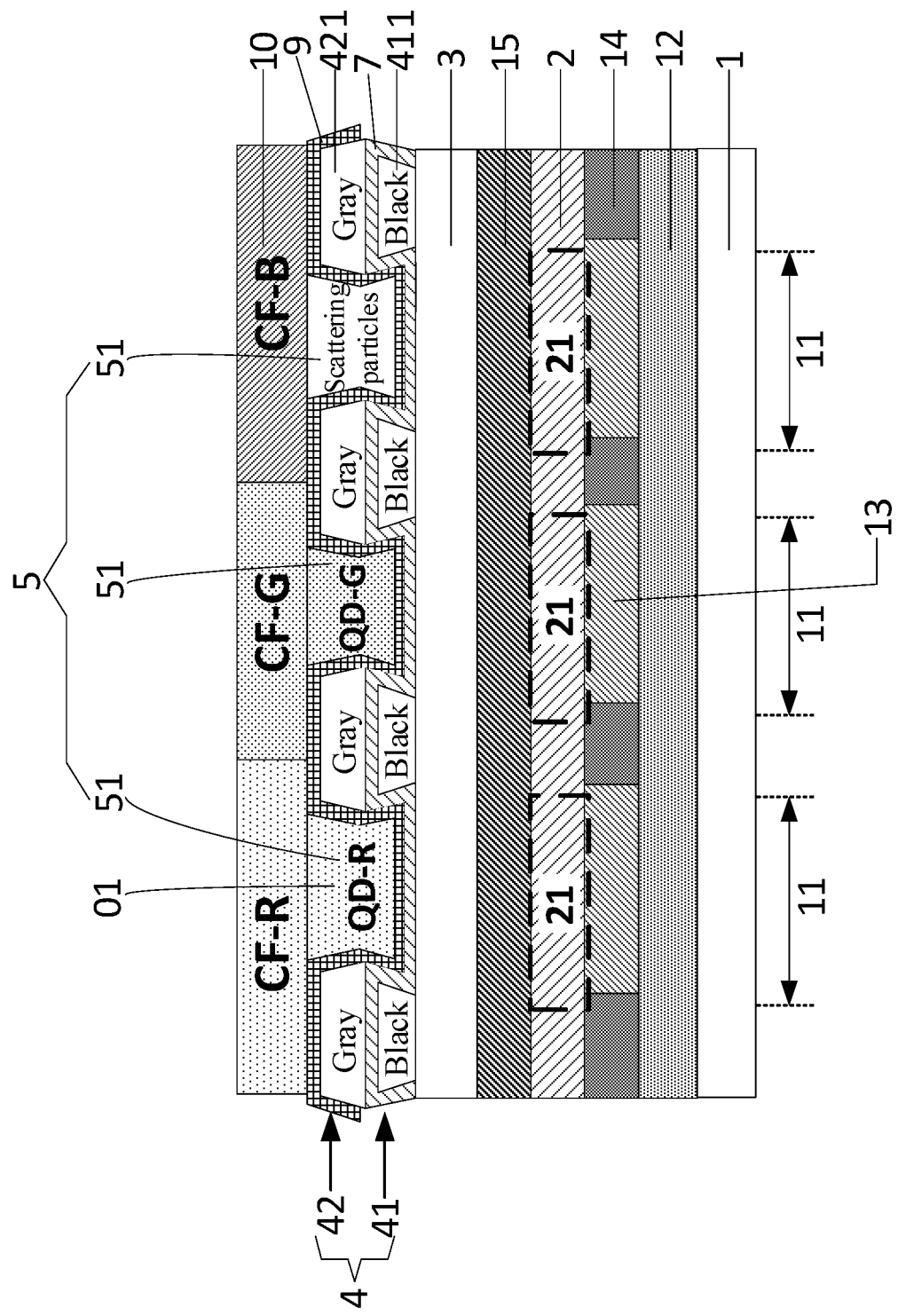
FIG. 16 is a structural schematic diagram of another display panel provided with a first sub-pixel defining layer of black and a second sub-pixel defining layer of gray according to some embodiments.
Figure 17:
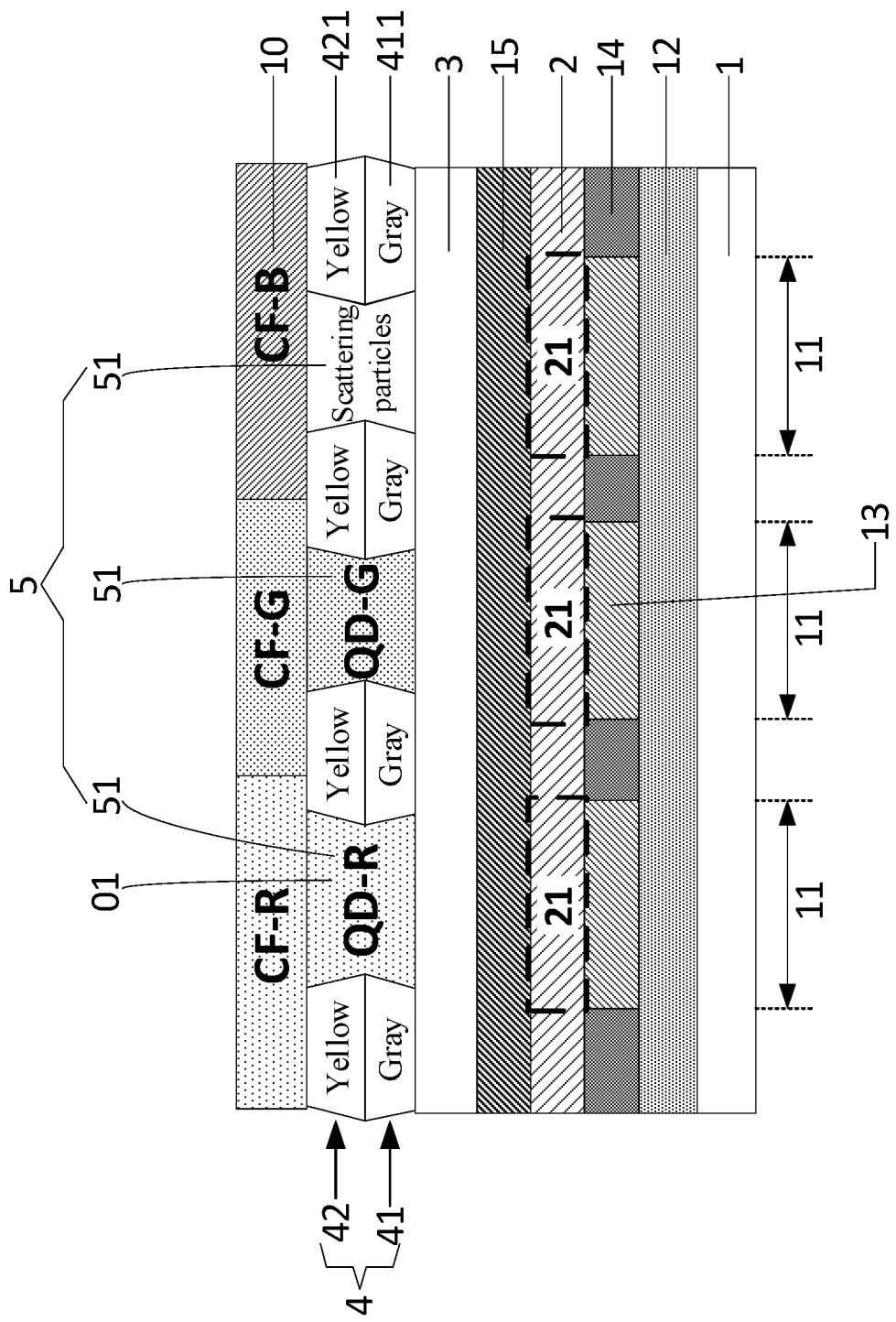
FIG. 17 is a structural schematic diagram of a display panel provided with a first sub-pixel defining layer of gray and a second sub-pixel defining layer of yellow according to some embodiments.
Figure 18:
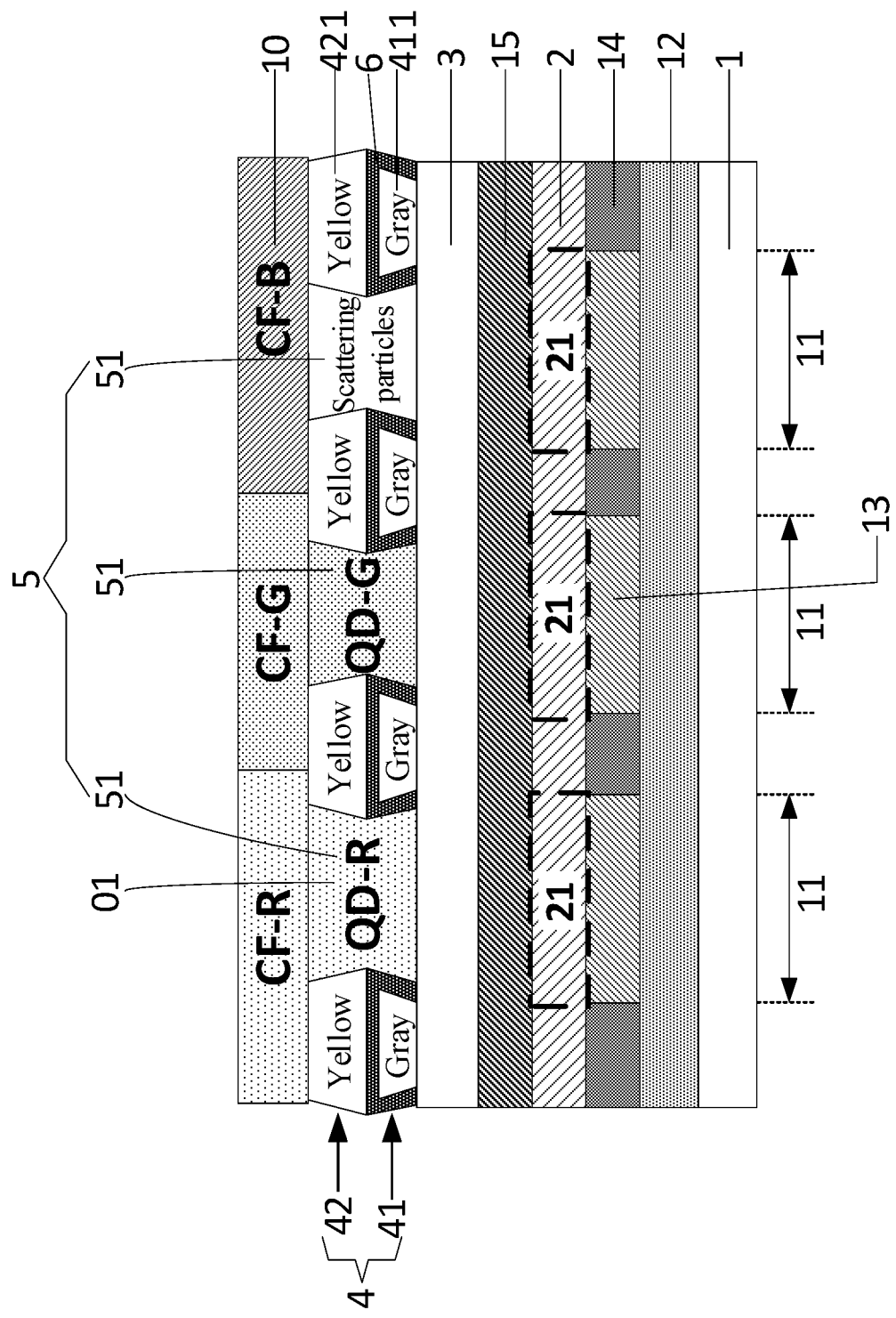
FIG. 18 is a structural schematic diagram of another display panel provided with a first sub-pixel defining layer of gray and a second sub-pixel defining layer of yellow according to some embodiments.
Figure 19:
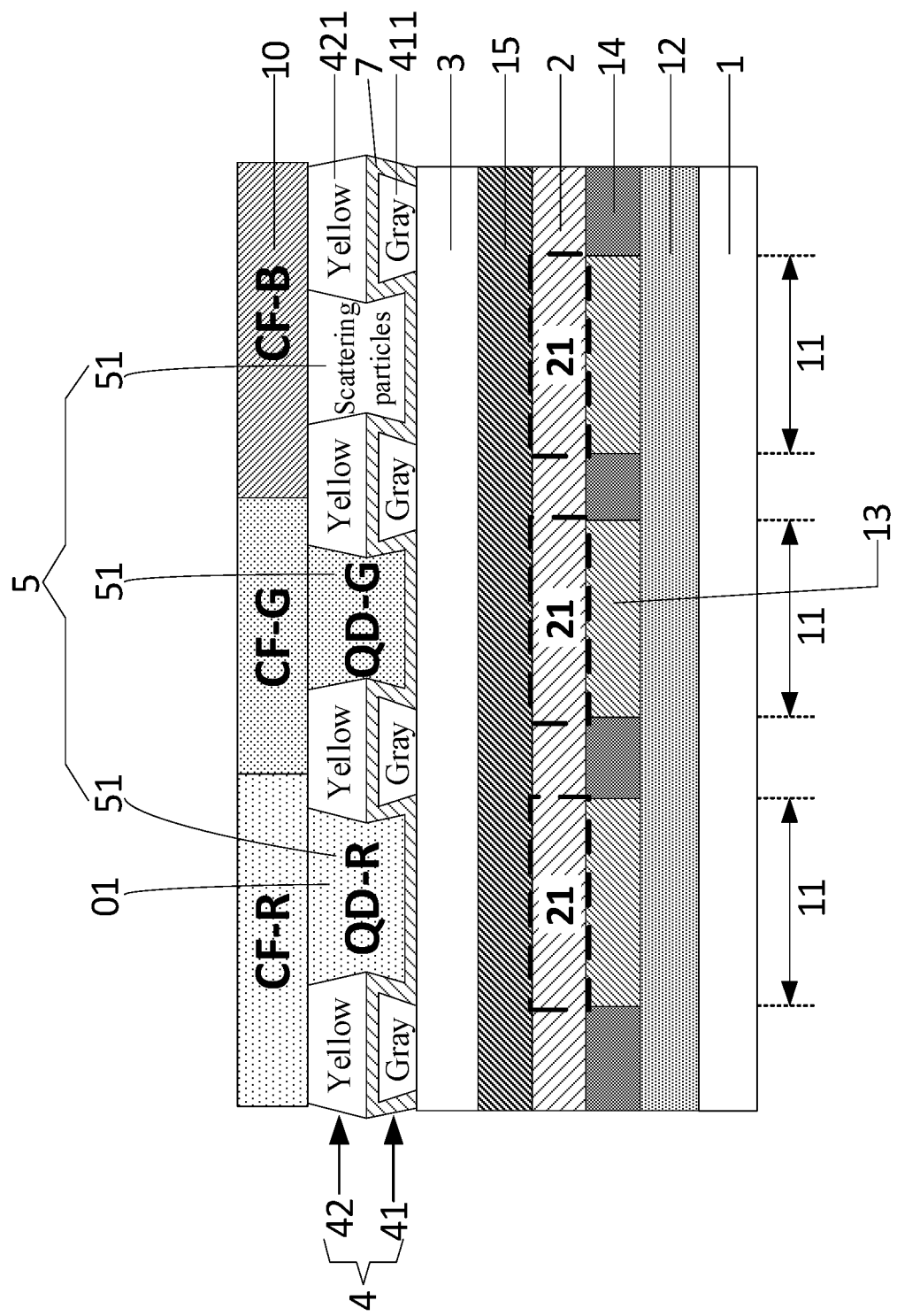
FIG. 19 is a structural schematic diagram of another display panel provided with a first sub-pixel defining layer of gray and a second sub-pixel defining layer of yellow according to some embodiments.
Figure 20:
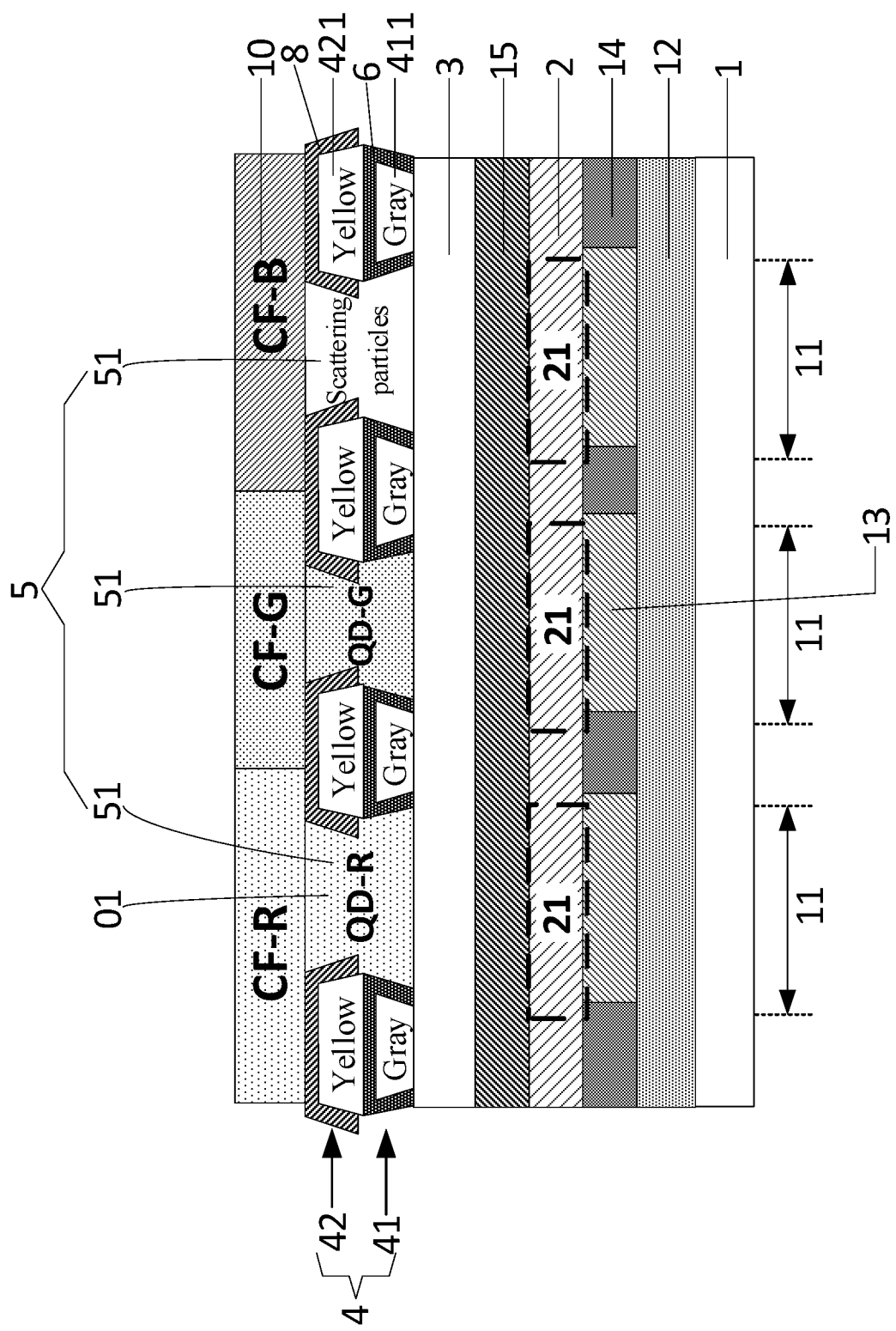
FIG. 20 is a structural schematic diagram of another display panel provided with a first sub-pixel defining layer of gray and a second sub-pixel defining layer of yellow according to some embodiments.
Figure 21:
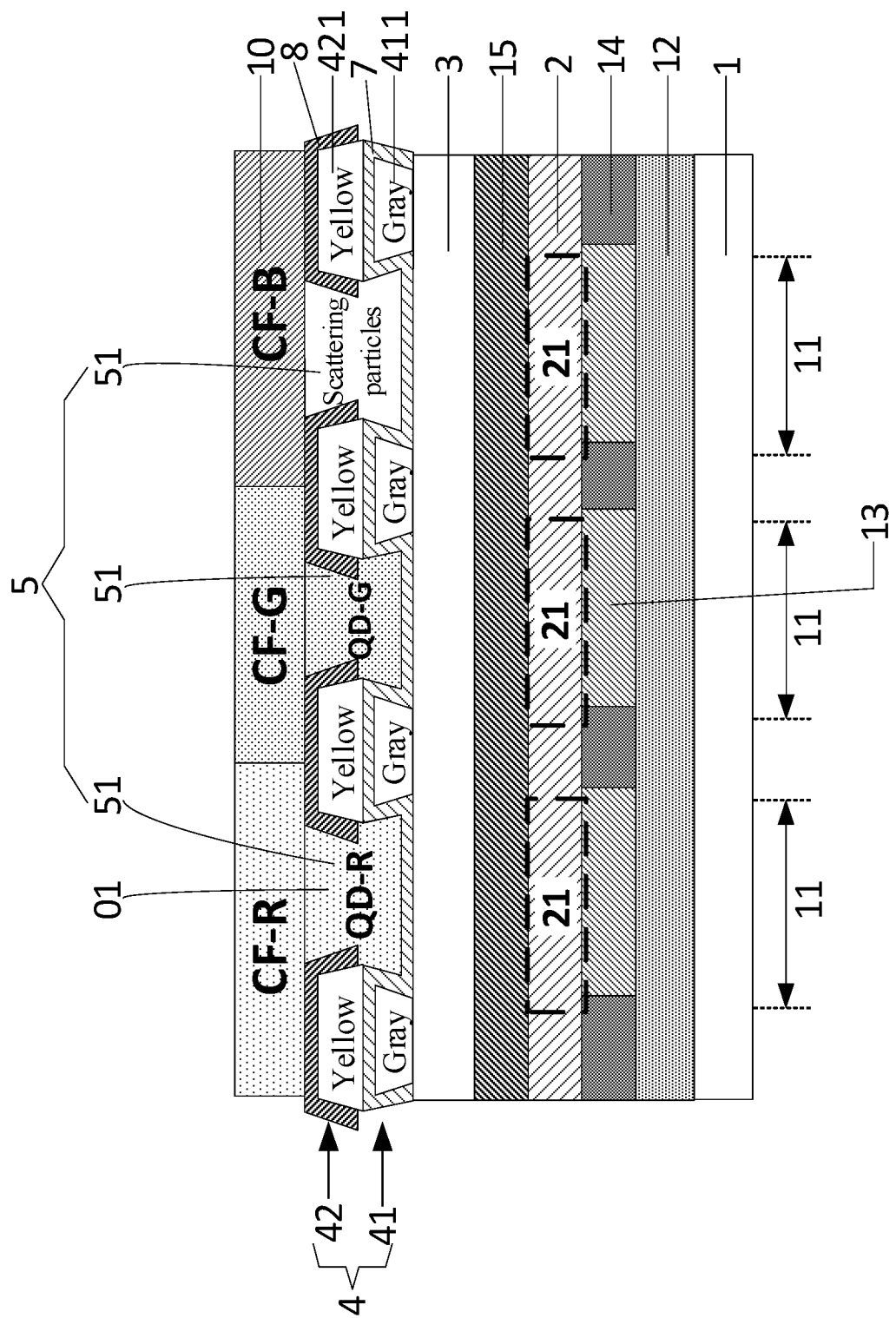
FIG. 21 is a structural schematic diagram of another display panel provided with a first sub-pixel defining layer of gray and a second sub-pixel defining layer of yellow according to some embodiments.
Figure 22:
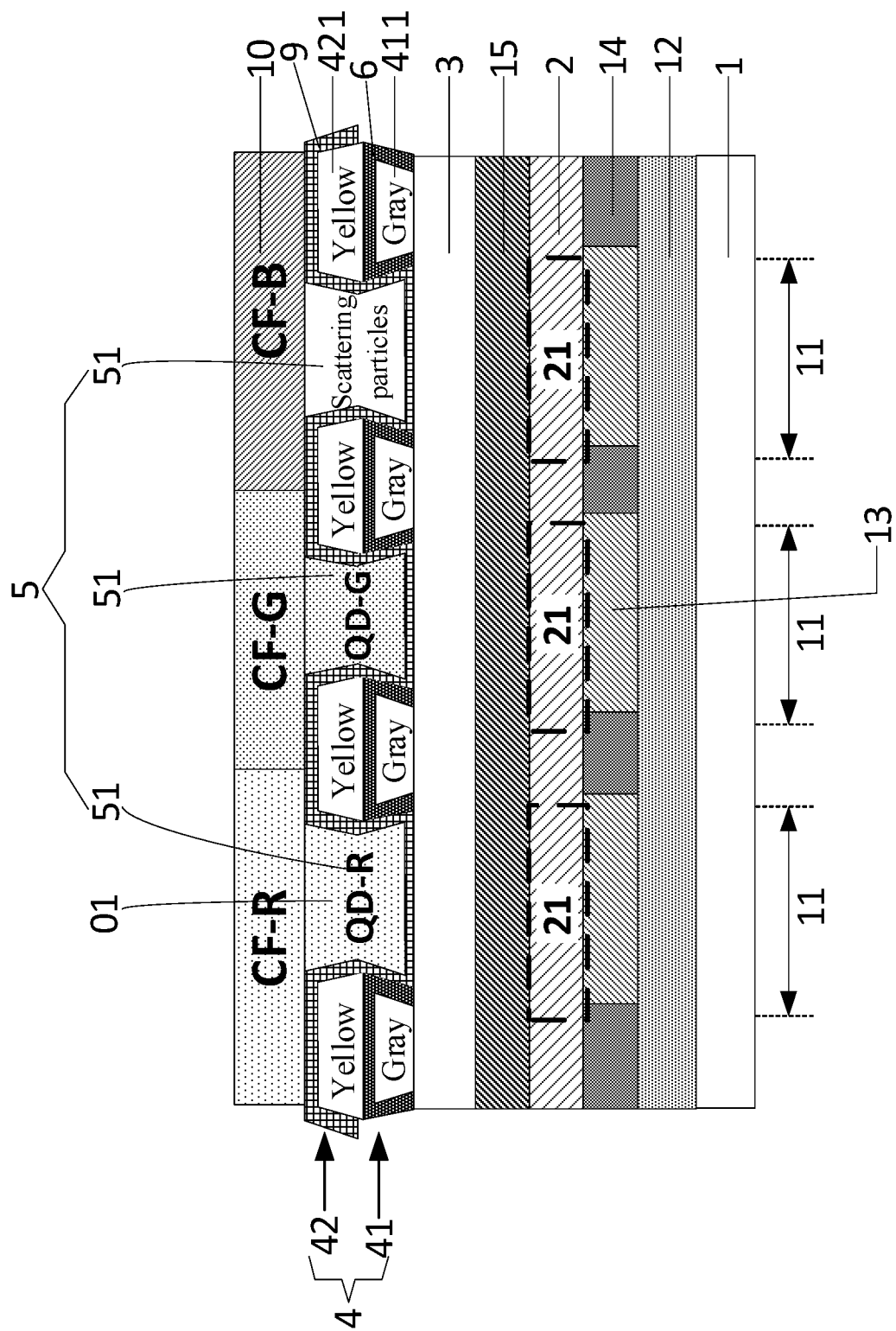
FIG. 22 is a structural schematic diagram of another display panel provided with a first sub-pixel defining layer of gray and a second sub-pixel defining layer of yellow according to some embodiments.
Figure 23:
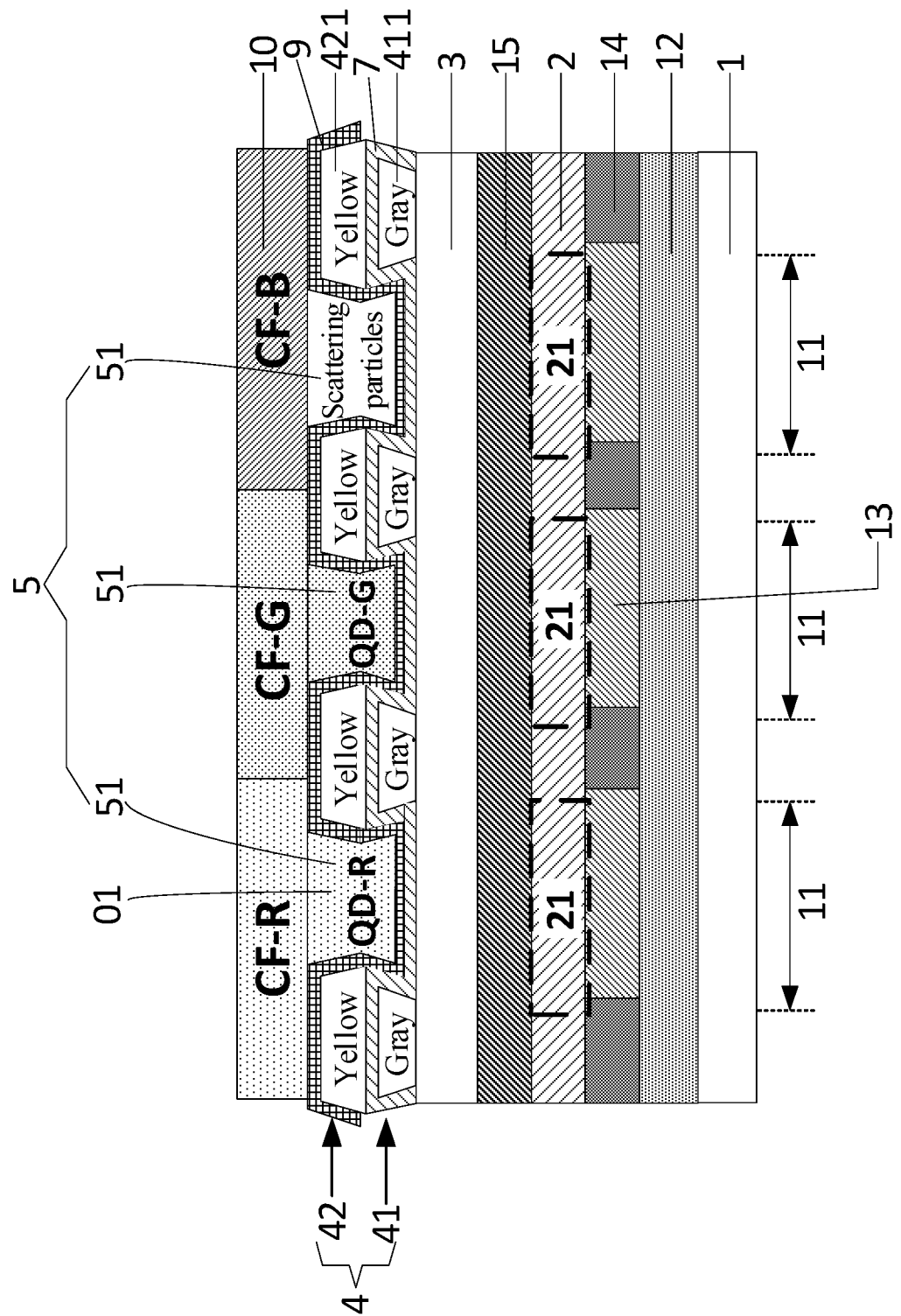
FIG. 23 is a structural schematic diagram of another display panel provided with a first sub-pixel defining layer of gray and a second sub-pixel defining layer of yellow according to some embodiments.

In some embodiments, as shown in FIG. 8 and FIG. 9, the above display panel provided in embodiments of the disclosure further includes a second graphene layer 9 covering the first pixel separator 411, the second pixel separator 421 and the opening 01. The second graphene layer 9 is provided with an active functional group which can be tightly anchored to the quantum dot color film layer 5 through hydrogen bonds. In some embodiments, a layer of graphene can be deposited through a chemical vapor deposition (CVD) process on a side, facing away from the base substrate 1, of the second sub-pixel defining layer 42. Performing surface plasma activation processing on the graphene, such that the surface can be provided with a large number of active functional groups, to obtain a functional second graphene layer 9. Through the active functional group on the surface of the functionalized second graphene layer 9, the quantum dots in the quantum dot color film layer 5 can be tightly anchored on the surface of the functionalized second graphene layer 9 through hydrogen bonds, thereby forming a dense and uniform quantum dot color film layer 5 to further prevent crosstalk of quantum dots to a neighboring sub-pixel area 11, and thus improve film formation uniformity of the quantum dot color film layer 5 simultaneously. Moreover, the functionalized second graphene layer 9 can provide more printing sites (that is, more quantum dots can be anchored than before), thereby reducing the thickness of the quantum dot color film layer 5 in a certain extent, improving the original complex thick-film process, and saving materials and lowering cost simultaneously.

In some embodiments, in the above display panel provided in embodiments of the disclosure, the thickness of the second graphene layer can be 100 nm-2000 nm.

In some embodiments, as shown in FIG. 1 to FIG. 3 and FIG. 6 to FIG. 9, the sum of the thickness of the first sub-pixel defining layer 41 and the second sub-pixel defining layer 42 is 10 um-15 um, and the thickness of the quantum dot color film layer 5 is 10 um-15 um.

In some embodiments, as shown in FIG. 1 to FIG. 3 and FIG. 6 to FIG. 9, the thickness of the first sub-pixel defining layer 41 can be 2 um-8 um; and the thickness of the second sub-pixel defining layer 42 can be 2 um-8 um. The material of the first sub-pixel defining layer 41 and the second sub-pixel defining layer 42 can be acrylic resin.

In some embodiments, the color of the first sub-pixel defining layer can be one selected from black, yellow, gray or white, and the color of the second sub-pixel defining layer can be one selected from black, yellow, gray or white. In some embodiments, the black defining layer has a stronger ability in absorbing light than the yellow, gray and white defining layer. In some embodiments, for a purpose of improving the light emitting efficiency of the quantum dot color film layer, the color of the pixel defining layer can be set to yellow, gray or white. In some embodiments, for a purpose of avoiding influence of the external ambient light on the display device, the color of the display defining layer can be set to black. That is, the color can be selected according to actual requirements. For example, as shown in FIG. 1 to FIG. 3 and FIG. 6 to FIG. 9, the color of the first sub-pixel defining layer 41 is black, and the color of the second sub-pixel defining layer 42 is yellow; as shown in FIG. 10 to FIG. 16, the color of the first sub-pixel defining yellow. Of course, the color of the first sub-pixel defining layer 41 and the second sub-pixel defining layer 42 can also be color of other combinations, which is not enumerated herein.

It should be noted that, the structures shown in FIG. 10 to FIG. 16 correspond to the structures shown in FIG. 1 to FIG. 3 and FIG. 6 to FIG. 9 respectively, and the difference lies in different colors of the second sub-pixel defining layer 42; and the structures shown in FIG. 17 to FIG. 23 correspond to the structures shown in FIG. 1 to FIG. 3 and FIG. 6 to FIG. 9 respectively, and the difference lies in that the color of the first sub-pixel defining layer 41 is correspondingly different from the color of the second sub-pixel defining layer 42.

In some embodiments, in the above display panel provided in embodiments of the disclosure, yellow, gray and white color film defining layers can be provided with inorganic nanoparticles. Inorganic nanoparticles generally have a scattering effect and are used for scattering light incident into a side wall of the pixel defining layer, to further improve the luminous efficiency of the quantum dot color film layer.

In some embodiments, the particle size of the inorganic nanoparticles can be 50 nm-400 nm.

In some embodiments, in the above display panel provided in embodiments of the disclosure, the inorganic nanoparticles can be one of the $TiO_2$ and $SiO_2$ or a combination thereof. Of course, the inorganic nanoparticles can also be other materials with a reflective effect, which is not enumerated herein.

Inventors of the present application conducted experiments on the influence of using sub-pixel defining layers of different colors on enhancing the luminous efficiency of the quantum dot color film layer, and the experimental results are shown in the following table:

|  | | | Black | | Gray | | Yellow | |
| --- | --- | --- | --- | --- | --- | --- | --- | --- |
|  | Index | Backlight brightness/nit | Red light brightness/nit | Green light brightness/nit | Red light brightness/nit | Green light brightness/nit | Red light brightness/nit | Green light brightness/nit |
| Actual test result | Test brightness/nit | 1308 | 171 | 607 | 308 | 1205 | 307 | 1077 |
|  | Feature brightness/nit | — | 151.26 | 547.18 | 274.50 | 1126.52 | 279.71 | 1009.04 |
|  | Blue light absorption rate | — | 98.525% | 95.42% | 97.421% | 94.01% | 97.927% | 94.84% |
|  | EQE | — | 5.71% | 3.69% | 11.25% | 7.72% | 12.22% | 6.84% |
|  | CD/um | — | 20.5 | | 25.0 | | 26.5 | |
|  | THK/um | | 12.25 | | 15.05 | | 13.50 | |
|  | QD-R/um | — | 11.2 | — | 11.6 | — | 11.6 | — |
|  | QD-G/um | — | — | 12.4 | — | 12.7 | — | 13 |
| Result correction | Feature brightness/nit |  | 100% | 100% | 195% | 198% | 198% | 201% |
| Results | The QD luminous efficiency improvement effects by Gray and Yellow bank are basically consistent, and the luminous efficiency can be improved by nearly 100% compared with black; (black bank is taken as 100% reference) | | | | | | | | layer 41 is black, and the color of the second sub-pixel defining layer 42 is gray; and as shown in FIG. 17 to FIG. 23, the color of the first sub-pixel defining layer 41 is gray, and the color of the second sub-pixel defining layer 42 is In the above table, "Bank" refers to a sub-pixel defining layer.

Based on optical data in the above table when gray and yellow sub-pixel defining layers are adopted, gray and yellow sub-pixel defining layers are preferably selected. The luminous efficiency can be improved by about 100% compared with the black sub-pixel defining layer. Therefore, in the above display panel provided in embodiments of the disclosure, in the first sub-pixel defining layer and the second sub-pixel defining layer, one of the colors is yellow, and the other color is gray. For example, as shown in FIG. 17 to FIG. 23, the color of the first sub-pixel defining layer 41 is gray, and the color of the second sub-pixel defining layer 42 is yellow. Of course, the color of the first sub-pixel defining layer 41 can also be yellow, while the color of the second sub-pixel defining layer 42 can be gray.

In some embodiments, in the above display panel provided in embodiments of the disclosure, as shown in FIG. 1 to FIG. 3 and FIG. 6 to FIG. 23, the light emitting device 21 is a blue light emitting device, the quantum dot color film layer 5 includes a red quantum dot color film (QD-R), a green quantum dot color film (QD-G) and scattering particles. Since light is emitted by adopting three primary colors of red, green and blue, while the light emitting device 21 is a blue light emitting device, therefore, no blue quantum dot color film needs to be set at the position intended for the blue quantum dot color film, only scattering particles need to be filled. The scattering particles can play a role of improving the light emitting viewing angle.

When the OLED display device is in a screen-off state, a perfect black is desired. However, the quantum dot color film will be excited to emit light by the blue light in the ambient environment. For at least to solve this problem, as shown in FIG. 1 to FIG. 3 and FIG. 6 to FIG. 23, the above display panel provided in embodiments of the disclosure further includes a light-blocking color film 10 disposed on a side, facing away from the base substrate 1, of the pixel defining layer 4. In some embodiments, a red light-blocking color film (CF-R) is arranged at the position corresponding to the red quantum dot color film (QD-R), a green light-blocking color film (CF-G) is arranged at the position corresponding to the green quantum dot color film (QD-G), and a blue light-blocking color film (CF-B) is arranged at the position corresponding to the scattering particles, to block blue light in the external ambient light in a screen-off state, and improve product performance.

In some embodiments, as shown in FIG. 1 to FIG. 3, FIG. 6 to FIG. 23, the above display panel provided in embodiments of the disclosure further includes: a TFT drive board 12 between the base substrate 1 and the light emitting structure 2, an anode 13 and a pixel definition layer 14 between the TFT drive board 12 and the light emitting structure 2, and a cathode 15 between the light emitting structure 2 and the encapsulating layer 3.

In some embodiments, the TFT drive board can include a base substrate, a buffer layer arranged on the base substrate, a low-temperature polycrystalline silicon layer formed on the buffer layer, a gate insulating layer formed on the low-temperature polycrystalline silicon layer, a gate layer formed on the gate insulating layer, an interlayer insulating layer formed on the gate layer, a source/drain metal layer formed on the interlayer insulating layer, and a planarization layer formed on the source/drain metal layer, and then an anode is formed on the planarization layer, a pixel definition layer is formed on the anode, and a spacer layer is formed on the pixel definition layer.

In some embodiments, the light emitting structure 2 includes a light emitting layer, through a TFT drive board 12, anode voltage is input into the anode 13 and cathode voltage is input into the cathode 15. That is, driven by the external voltage, electrons injected by the cathode 15 and holes injected by the anode 13 are combined in a light emitting layer to form electron hole pairs of a bound level, that is, excitons, and exciton radiation degenerates photons to generate visible light.

Of course, the display panel provided in embodiments of the disclosure can also include other functional film layers which are well known to those skilled in the art, which will not be described in detail herein.

The display panel provided in embodiments of the disclosure can solve the problems of difficulty in material development of the pixel defining layer for the thick film process of quantum dot color film, and crosstalk of adjacent pixels occurring to quantum dot ink. In addition, the display panel can also improve luminous efficiency, and is a novel device structure based on quantum dots.

Based on the same disclosed concept, embodiments of the disclosure further provide a display device which includes the above display panel provided in embodiments of the disclosure. The display device solves problems based on similar principles as the aforesaid display panel, therefore, for the implementation of the display device, please refer to the implementation of the aforesaid display panel, and the repeated parts are not repeated redundantly herein.

In some embodiments, the above display device provided in embodiments of the disclosure can be an organic light emitting display device.

In some embodiments, the above display device provided in embodiments of the disclosure can be a full screen display device, and can also be a flexible display device, which is not defined herein.

Figure 24:
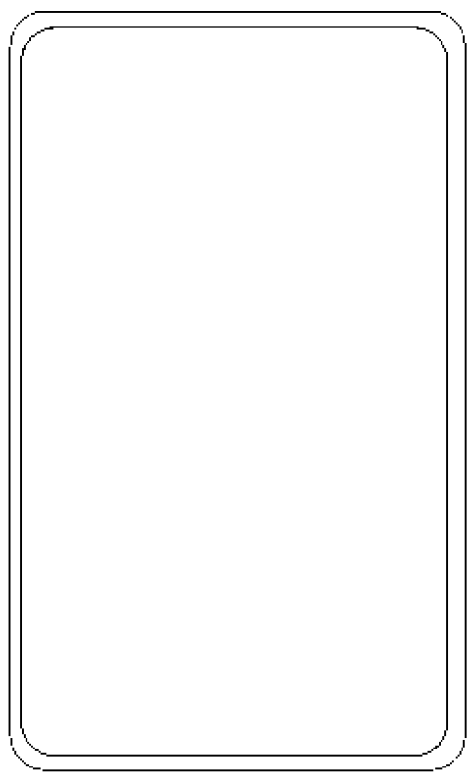
FIG. 24 is a structural schematic diagram of a display device provided in embodiments of the disclosure.

In some embodiments, the above display device provided in embodiments of the disclosure can also be a mobile phone with a full screen as shown in FIG. 24. Of course, the above display device provided in embodiments of the disclosure may also be a tablet computer, a television, a display, a notebook computer, a digital photo frame, a navigator, or any other product or component with a display function. Other indispensable components of the display device are present as understood by those skilled in the art, and are not described herein, nor should they be construed as limiting the disclosure.

Embodiments of the disclosure provide a display panel and a display device. In the display panel, the pixel defining layer is set to include at least two sub-pixel defining layers, a thicker pixel defining layer can be manufactured through two manufacturing processes, and the problem of development residue when the pixel defining layer is manufactured in a single time will not exist, therefore, the disclosure solves the problem difficulty in material development of the pixel defining layer for the thick film process of quantum dot color film.

Obviously, those skilled in the art can make various modifications and variations to the disclosure without departing from the spirit and scope of the disclosure. Thus, the disclosure is also intended to encompass these modifications and variations thereto so long as the modifications and variations come into the scope of the claims of the disclosure and their equivalents.

What is claimed is:
1. A display panel, having a plurality of sub-pixel areas in an array and comprising:
    a base substrate;
    a light emitting structure, disposed on a side of the base substrate, and comprising a plurality of light emitting devices in one-to-one correspondence with the plurality of sub-pixel areas;

an encapsulating layer, disposed on a side, facing away from the base substrate, of the light emitting structure; and a pixel defining layer, disposed on a side, facing away from the base substrate, of the encapsulating layer;

wherein the pixel defining layer comprises:

a plurality of openings;

at least two sub-pixel defining layers, wherein each of the sub-pixel defining layers is provided with a pixel separator; wherein the pixel separator fences each of the plurality of openings, and defines the plurality of sub-pixel areas; in the at least two sub-pixel defining layers, a sectional shape of the pixel separator in the sub-pixel defining layer which is farthest away from the encapsulating layer comprises a regular trapezoid; and a quantum dot color film layer, comprising a plurality of quantum dot color films arranged in corresponding openings;

wherein the at least two sub-pixel defining layers comprise a first sub-pixel defining layer closest to the encapsulating layer, and a second sub-pixel defining layer farthest away from the encapsulating layer; wherein the first sub-pixel defining layer is provided with a first pixel separator, and a sectional shape of the first pixel separator comprises an inverted trapezoid or a rectangle; and the second sub-pixel defining layer is provided with a second pixel separator, and the sectional shape of the second pixel separator comprises a regular trapezoid;

wherein the display panel further compries:

a first reflective structure covering the first pixel separator, wherein a material of the first reflective structure is metal; and a second graphene layer covering the first pixel separator, the second pixel separator and the plurality of openings, wherein the second graphene layer is provided with an active functional group which can be tightly anchored to the quantum dot color film layer through hydrogen bonds.

2. A display device, comprising the display panel according to claim 1.

3. A display panel, having a plurality of sub-pixel areas in an array and comprising:

a base substrate;

a light emitting structure, disposed on a side of the base substrate, and comprising a plurality of light emitting devices in one-to-one correspondence with the plurality of sub-pixel areas;

an encapsulating layer, disposed on a side, facing away from the base substrate, of the light emitting structure; and a pixel defining layer, disposed on a side, facing away from the base substrate, of the encapsulating layer;

wherein the pixel defining layer comprises:

a plurality of openings;

at least two sub-pixel defining layers, wherein each of the sub-pixel defining layers is provided with a pixel separator; wherein the pixel separator fences each of the plurality of openings, and defines the plurality of sub-pixel areas; in the at least two sub-pixel defining layers, a sectional shape of the pixel separator in the sub-pixel defining layer which is farthest away from the encapsulating layer comprises a regular trapezoid; and a quantum dot color film layer, comprising a plurality of quantum dot color films arranged in corresponding openings;

wherein the at least two sub-pixel defining layers comprise a first sub-pixel defining layer closest to the encapsulating layer, and a second sub-pixel defining layer farthest away from the encapsulating layer; wherein the first sub-pixel defining layer is provided with a first pixel separator, and a sectional shape of the first pixel separator comprises an inverted trapezoid or a rectangle; and the second sub-pixel defining layer is provided with a second pixel separator, and the sectional shape of the second pixel separator comprises a regular trapezoid;

wherein the display panel further compries a first graphene layer covering the first pixel separator and covering the plurality of openings, wherein the first graphene layer is provided with an active functional group which can be tightly anchored to the quantum dot color film layer through hydrogen bonds.

4. The display panel of claim 3, further comprising a second reflective structure covering the second pixel separator, wherein a material of the second reflective structure is metal.

5. The display panel of claim 3, further comprising a second graphene layer covering the first pixel separator, the second pixel separator and the plurality of openings, wherein the second graphene layer is provided with an active functional group which can be tightly anchored to the quantum dot color film layer through hydrogen bonds.

6. The display panel of claim 3, wherein a sum of a thickness of the first sub-pixel defining layer and a thickness of the second sub-pixel defining layer is 10 um-15 um, and a thickness of the quantum dot color film layer is 10 um-15 um.

7. The display panel of claim 3, wherein a color of the first sub-pixel defining layer is one of black, yellow, gray and white, and a color of the second sub-pixel defining layer is one of black, yellow, gray or white.

8. The display panel of claim 7, wherein a film defining layer of yellow, gray or white is provided with inorganic nanoparticles, and the inorganic nanoparticles scatter light incident into a side wall of the pixel defining layer.

9. The display panel of claim 8, wherein the inorganic nanoparticles are at least one of $TiO_2$ and $SiO_2$.

10. The display panel of claim 7, wherein the first sub-pixel defining layer is yellow and the second sub-pixel defining layer is gray; or the first sub-pixel defining layer is gray and the second sub-pixel defining layer is yellow.

11. A display device, comprising the display panel according to claim 3.

12. A display panel, having a plurality of sub-pixel areas in an array and comprising:

a base substrate;

a light emitting structure, disposed on a side of the base substrate, and comprising a plurality of light emitting devices in one-to-one correspondence with the plurality of sub-pixel areas;

an encapsulating layer, disposed on a side, facing away from the base substrate, of the light emitting structure; and a pixel defining layer, disposed on a side, facing away from the base substrate, of the encapsulating layer;

wherein the pixel defining layer comprises:

a plurality of openings;

at least two sub-pixel defining layers, wherein each of the sub-pixel defining layers is provided with a pixel separator; wherein the pixel separator fences each of the plurality of openings, and defines the plurality of sub-pixel areas; in the at least two sub-pixel defining layers, a sectional shape of the pixel separator in the sub-pixel defining layer which is farthest away from the encapsulating layer comprises a regular trapezoid; and a quantum dot color film layer, comprising a plurality of quantum dot color films arranged in corresponding openings;

wherein the at least two sub-pixel defining layers comprise a first sub-pixel defining layer closest to the encapsulating layer, and a second sub-pixel defining layer farthest away from the encapsulating layer; wherein the first sub-pixel defining layer is provided with a first pixel separator, and a sectional shape of the first pixel separator comprises an inverted trapezoid or a rectangle; and the second sub-pixel defining layer is provided with a second pixel separator, and the sectional shape of the second pixel separator comprises a regular trapezoid;

wherein the display panel further compries a second graphene layer covering the first pixel separator, the second pixel separator and the plurality of openings, wherein the second graphene layer is provided with an active functional group which can be tightly anchored to the quantum dot color film layer through hydrogen bonds.

13. The display panel of claim 12, wherein a sum of a thickness of the first sub-pixel defining layer and a thickness of the second sub-pixel defining layer is 10 um-15 um, and a thickness of the quantum dot color film layer is 10 um-15 um.

14. The display panel of claim 12, wherein a color of the first sub-pixel defining layer is one of black, yellow, gray and white, and a color of the second sub-pixel defining layer is one of black, yellow, gray or white.

15. The display panel of claim 14, wherein a film defining layer of yellow, gray or white is provided with inorganic nanoparticles, and the inorganic nanoparticles scatter light incident into a side wall of the pixel defining layer.

16. The display panel of claim 15, wherein the inorganic nanoparticles are at least one of $TiO_2$ and $SiO_2$.

17. The display panel of claim 14, wherein the first sub-pixel defining layer is yellow and the second sub-pixel defining layer is gray; or the first sub-pixel defining layer is gray and the second sub-pixel defining layer is yellow.

18. The display panel of claim 12, wherein the light emitting device is a blue light emitting device, and the quantum dot color film layer comprises a red quantum dot color film, a green quantum dot color film and scattering particles.

19. The display panel of claim 12, further comprising a light-blocking color film disposed on a side, facing away from the base substrate, of the pixel defining layer.

20. A display device, comprising the display panel according to claim 12.

* * * * *